US006899988B2

(12) United States Patent
Kidnie et al.

(10) Patent No.: US 6,899,988 B2
(45) Date of Patent: May 31, 2005

(54) LASER THERMAL METALLIC DONORS

(75) Inventors: Kevin M. Kidnie, St. Paul, MN (US); Elsie A. Fohrenkamm, St. Paul, MN (US); Gregory L. Zwaldo, Ellsworth, WI (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/461,738

(22) Filed: Jun. 13, 2003

(65) Prior Publication Data

US 2004/0253534 A1 Dec. 16, 2004

(51) Int. Cl.[7] .......................... G03F 7/34; G03F 7/095; G03F 7/105

(52) U.S. Cl. .................... 430/200; 430/964; 430/273.1

(58) Field of Search ............................ 430/200, 273.1, 430/964

(56) References Cited

U.S. PATENT DOCUMENTS

| | | | |
|---|---|---|---|
| 1,501,499 | A | 7/1924 | Swift, Jr. |
| 2,701,245 | A | 2/1955 | Lynn |
| 3,962,513 | A | 6/1976 | Eames |
| 4,190,321 | A | 2/1980 | Dorer et al. |
| 4,252,843 | A | 2/1981 | Dorer et al. |
| 4,321,087 | A | 3/1982 | Levine et al. |
| 4,370,276 | A | 1/1983 | Appel et al. |
| 4,479,718 | A | 10/1984 | Alman |
| 4,876,235 | A | 10/1989 | DeBoer |
| 4,885,225 | A | 12/1989 | Heller et al. |
| 4,950,639 | A | 8/1990 | DeBoer et al. |
| 5,019,549 | A | 5/1991 | Kellogg et al. |
| 5,126,760 | A | 6/1992 | DeBoer |
| 5,156,938 | A | 10/1992 | Foley et al. |
| 5,171,650 | A | 12/1992 | Ellis et al. |
| 5,238,736 | A | 8/1993 | Tseng et al. |
| 5,256,506 | A | 10/1993 | Ellis et al. |
| 5,278,023 | A | 1/1994 | Bills et al. |
| 5,308,737 | A | 5/1994 | Bills et al. |
| 5,326,619 | A | 7/1994 | Dower et al. |
| 5,380,644 | A | 1/1995 | Yonkoski et al. |
| 5,395,729 | A | 3/1995 | Reardon et al. |
| 5,464,723 | A | 11/1995 | Chou |
| 5,475,418 | A | 12/1995 | Patel et al. |
| 5,501,937 | A | 3/1996 | Matsumoto et al. |
| 5,516,622 | A | 5/1996 | Savini et al. |
| 5,518,861 | A | 5/1996 | Coveleskie et al. |
| 5,534,383 | A | 7/1996 | Takahashi et al. |
| 5,766,819 | A | 6/1998 | Blanchet-Fincher |
| 5,935,758 | A | 8/1999 | Patel et al. |
| 6,001,530 | A | 12/1999 | Kidnie et al. |
| 6,190,827 | B1 | 2/2001 | Weidner |
| 6,197,474 | B1 | 3/2001 | Niemeyer et al. |
| 6,291,143 | B1 | 9/2001 | Patel et al. |
| 2001/0004485 | A1 | 6/2001 | Yohnosuke et al. |
| 2002/0061391 | A1 | 5/2002 | Nobuho et al. |

FOREIGN PATENT DOCUMENTS

| | | |
|---|---|---|
| EP | 0 157 568 | 10/1985 |
| EP | 0 160 395 | 11/1985 |
| EP | 0 160 396 | 11/1985 |
| EP | 0 382 420 | 8/1990 |
| EP | 0 530 018 | 3/1993 |
| EP | 0 602 893 | 6/1994 |
| EP | 0623478 | 11/1994 |
| EP | 0 675 003 | 10/1995 |
| EP | 0 745 489 | 12/1996 |
| JP | 63-319191 | 12/1988 |
| JP | 63-319192 | 12/1988 |
| JP | 02-164148 | 12/1990 |
| JP | 08-151526 | 11/1996 |
| WO | WO98/07575 | 2/1998 |
| WO | WO 02/47447 | 6/2002 |

OTHER PUBLICATIONS

Article: *Characterising special–effect colour*, by A. Gilchrist, Surface coating International Part B, Coating Transactions, vol. 85, B4, Nov. 2002, pp 281–285.

Article: *Metallic Donor for Direct Digital Halftone Proofing*, by David A. Niemeyer, IS&T's NIP18: 2002 International Conference on Digital Printing Technologies, pp 718–722.

*Primary Examiner*—Richard L. Schilling
(74) *Attorney, Agent, or Firm*—Faegre & Benson, LLP

(57) ABSTRACT

A laser-induced thermal imaging system having a multilayer construction donor element and a receptor element for the preparation of a metallic digital half tone color proof having an improved shiny metallic appearance. The donor element includes a substrate on which is coated at least two layers. The donor element includes a first layer coated on one side of the substrate having at least a first donor binder and a cationic infrared absorbing dye. The donor layer also includes a distinct second layer coated on the first layer. The second layer includes at least a second donor binder, a cationic infrared absorbing dye, a latent crosslinking agent, a fluorocarbon additive, metallic flakes and a dispersible material. The receptor element of the present invention includes a substrate coated with at least a receptor binder and a bleaching agent.

57 Claims, No Drawings

LASER THERMAL METALLIC DONORS

FIELD OF THE INVENTION

The present invention is directed to the preparation of a metallic digital half tone color proof having an improved shiny metallic appearance using a laser-induced thermal imaging system. More specifically, the system of the present invention involves the mass transfer of metallic flakes from a multi-layer donor element to a receptor element under the influence of the energy supplied by a laser.

BACKGROUND OF THE INVENTION

There is an important commercial need to obtain a color proof that will accurately represent at least the details and color tone scale of the image before a printing press run is made. In many cases, it is also desirable that the color proof accurately represents the image quality and halftone pattern of the prints obtained on the printing press. In the sequence of operations necessary to produce an ink-printed, full-color picture, a proof is also required to check the accuracy of the color separation data from which the final three or more printing plates or cylinders are made.

Multiple dye-donors are generally used to obtain a range of colors in the proof as is described in U.S. Pat. No. 5,126,760 (DeBoer). For a full-color proof, four colors (cyan, magenta, yellow and black) are normally used. Although a wide gamut of printing ink colors can be matched by just a few dye-donor elements, there are certain types of inks and pigments used in the printing industry that cannot be matched by any combination of dyes. Notable among these types of inks and pigments are the metallics, white and opaque spot colorants.

A continuing trend in the printing industry is the increasing use of specialty inks such as metallic specialty inks. Metallic specialty inks can increase color gamut, provide signature colors, and generate special effects. In the advertising and packaging marketplaces this translates into greater appeal and recognition. Although the particular color can be approximated by standard process color inks, the specular reflectivity characteristic that gives metallic colors their special appeal requires the use of metal flakes in the metallic specialty ink formulation.

In response to the increased use of metallic specialty inks, a single layer, metallic donor formulated using an aluminum flake was developed for the KODAK APPROVAL XP digital color proofing system disclosed in U.S. Pat. No. 6,197,474 (Niemeyer, et al.).

The KODAK APPROVAL XP system uses successive dye containing donor films placed against an intermediate receiver film and exposed through the base of the donor films with an 830 nm laser diode array. Because the KODAK APPROVAL XP system is capable of printing multiple colors at variable density at the same location, multiple metallic dye-donor films need not be developed. Gold, bronze, copper, and the host of metallic reds, greens and blues can be obtained by overprinting brilliant silver. The multicolor dye image, along with the top layer of the intermediate receiver film, is laminated to a final receiver.

The mechanism of dye transfer in the KODAK APPROVAL XP digital color proofing system is volatilization. This mechanism is not well suited, however, for the transfer of non-volatile aluminum flakes and does not produce the resolution necessary for accurate halftone color proofs.

The use of a two-layer film in a laser ablative process is described in "Metallic Donor for Direct Digital Halftone Proofing", IS&T's NIP18: 2002 International Conference on Digital Printing Technologies, David A. Niemeyer, pp. 718–21. A two-layer film for use in an ablative process in which a metallic flake layer overlays an infrared, radiation sensitive, propellant layer is reported. Gasification of the propellant layer upon exposure by an 830 nm laser diode array provides the motive force to transfer the metallic flake layer from the donor to the receiver. Specific polymers are selected which decompose upon exposure to heat to rapidly generate a gas. Examples of other laser ablative systems may be found in U.S. Pat. No. 5,516,622 (Savini, et al.); U.S. Pat. No. 5,518,861 (Coveleski, et al.); U.S. Pat. No. 5,326,619 (Dower, et al.); U.S. Pat. No. 5,308,737 (Bills, et al.); U.S. Pat. No. 5,278,023 (Bills, et al.); U.S. Pat. No. 5,256,506 (Ellis, et al.); U.S. Pat. No. 5,171,650 (Ellis, et al.); U.S. Pat. No. 5,156,938 (Foley, et al.); and U.S. Pat. No. 3,962,513 (Eames).

There is a problem with this laser ablative transfer mechanism, however, as the use of propulsive forces introduce a tendency for the colorant to scatter and produce less well defined dots made of many fragments. Attempts have been made to produce more well defined dots using an ablative system as described in U.S. Pat. No. 5,156,938 (Foley) and U.S. Pat. No. 5,171,650 (Ellis); however, whether single layer or dual layer, such systems do not produce contract-quality images. Further, decomposition of the polymers selected to decompose upon exposure to heat to rapidly generate a gas lends to discoloration of the halftone color proof. Therefore, this process lacks the necessary resolution to produce an accurate halftone color proof.

Alternative mass transfer systems include a melt mechanism. In a melt mechanism, the colorant and associated binder materials transfer in a molten or semi-molten state (melt-stick transfer) to a receptor upon exposure to the radiation source. There is essentially 0% or 100% transfer of colorant depending on whether the applied energy exceeds a certain threshold. Examples of these types of systems may be found in JP 63-319192 (Seiichiro); JP 69-319192 (Naoji, et al.); EP 530 018 (Hitomi); EP 602 893 (Patel, et al.); EP 675 003 (Patel); EP 745 489 (Patel, et al.); U.S. Pat. No. 5,501,937 (Matsumoto, et al.); U.S. Pat. No. 5,401,606 (Reardon, et al.) and U.S. Pat. No. 5,019,549 (Kellogg, et al.).

In contrast to ablative systems, melt systems can in principle form more well-defined dots and sharper edges to achieve more reproducible and accurate colors, however, the system involves other disadvantages. Many of the known laser-induced melt transfer systems employ one or more waxes as binder materials. The use of waxes results in a transfer layer that melts sharply to a highly fluid state at moderately elevated temperatures, and hence gives a higher sensitivity; however, such systems arc prone to image spread as a result of wicking or uncontrolled flow of the molten transfer material. Furthermore, because the laser absorber is normally transferred along with the desired colorant, the final image may lack the accuracy of color rendition required for high quality proofing purposes. Others have attempted to increase the sensitivity by adding plasticizers (U.S. Pat. No. 5,401,606 (Reardon)), which lower the melt viscosity and increase the flow; however, the plasticizers soften the films such that they become receptive to impressions and blocking.

Thus, there is still a need for a laser-induced thermal transfer system that provides a halftone image incorporating metallic flakes in the form of discrete dots having well-defined, generally continuous edges that are relatively sharp with respect to density or edge definition.

SUMMARY OF THE INVENTION

The present invention provides a laser-induced thermal imaging system having a multi-layer construction donor element and a receptor element. The donor element includes a substrate on which is coated at least two layers. The donor element includes a first layer coated on one side of the substrate having at least a first donor binder and a cationic infrared absorbing. In an alternative embodiment of the present invention the first layer includes a first layer crosslinking agent that reacts upon exposure to heat treatment.

The donor element also includes a distinct second layer coated on the first layer. The second layer includes at least a second donor binder, a cationic infrared absorbing dye, a second layer crosslinking agent, a fluorocarbon additive, metallic flakes and a dispersible material. The receptor element of the present invention includes a substrate coated with at least a receptor binder and a bleaching agent. In another embodiment of the present invention the receptor element also includes optional additives such as particulate materials, surfactants, antioxidants, bleaching agents and combinations thereof.

The present invention also provides a method of imaging by providing a multi-layer construction donor element. The donor element of this embodiment includes a substrate coated with at least two layers such that the donor element includes a first layer coated on one side of the substrate and a distinct second layer coated on the first layer. The first layer of the donor element further includes at least a first donor binder and a cationic infrared absorbing dye. The second layer includes at least a second donor binder, a cationic infrared absorbing dye, a second layer crosslinking agent, a fluorocarbon additive, metallic flakes and a dispersible material. This embodiment of the present invention also includes providing a receptor element having a substrate coated with at least a receptor binder and a bleaching agent. In an alternative embodiment the receptor includes optional additives. A further aspect of this embodiment includes assembling the donor element in contact with the receptor element and exposing the assembly to laser radiation of a wavelength absorbed by the cationic infrared absorbing dye, said laser radiation being modulated in accordance with digitally stored image information, thereby transferring portions of the second layer from the donor element to the receptor element. This embodiment further includes separating the donor element and receptor element, leaving an image residing on the receptor element and subjecting the receptor and image residing thereon to heat treatment.

DETAILED DESCRIPTION

The system of the present invention involves a half tone laser-induced thermal imaging system comprising a multi-layer construction donor element for the production of half tone color proofs having a metallic appearance. More specifically, the system of the present invention involves the mass transfer of a metallic half tone image from a donor element (also referred to herein as the "donor") to a receptor element (also referred to herein as the "receptor") under the influence of the energy supplied by a laser.

The use of a laser is in contrast to systems that use thermal printheads to supply the energy needed for transfer of an image, which are typically referred to as "thermal transfer systems." The mass transfer system of the present invention is also in contrast to dye transfer systems that involve the formation of continuous tone (contone) images as well as the mass transfer systems using melt transfer and ablative transfer mechanisms. The mass transfer system of the present invention provides clean transfer of colorant, binder, and other additives in a laser-induced system. Further, the use of a multi-layer construction donor element provides an improved means of transferring non-volatile bulk materials such as metal flakes.

Gold and silver half tone color proofs have been generated using the present invention. The system is also capable of producing copper, bronze or other images using this approach. Compared to single layer metallic donor constructions, there is a dramatic improvement of the luster, glitter and overall shiny appearance of the resulting metallic half tone image.

The system of the present invention involves the mass transfer from the donor to the receptor of a half tone image in the form of discrete dots of a film of binder, specialty pigments in the form of metal flakes, colorants and additives. In one embodiment of the present invention, these materials are located in the second layer of a two-layer construction donor with the first layer located in between the substrate and second layer. The dots are formed from a molten or softened film, and have well-defined, generally continuous edges that are relatively sharp with respect to density or edge. In other words, the dots are formed with relatively uniform thickness over their area. Thus, the present invention provides a system in which excellent image quality of metallics where the colorant layer transfers essentially in the form of a coherent film, and does not apparently achieve a state of high fluidity during the transfer process. This transfer mechanism, referred to herein as a multi-layer laser-induced film transfer (multi-LIFT), is promoted by the inclusion of a crosslinking agent in the second donor layer that reacts with the second donor binder upon exposure to infrared laser radiation to form a high molecular weight network. The net effect of this crosslinking is better control of melt flow phenomena, transfer of more cohesive material to the receptor and higher quality dots. Although other systems involve crosslinking a colorant layer subsequent to transfer to the receptor to prevent back transfer during transfer of the next colorant layer, as in U.S. Pat. No. 5,395,729 (Reardon) and EP 160 395 (ICI) and 160 396 (ICI), the ability to effect crosslinking as a direct result of laser transfer, and hence produce a durable transferred image that is not prone to back transfer represents an improvement over Reardon and ICI.

Further, the multi-LIFT transfer mechanism is in contrast to systems that form discrete dots as a result of laser ablation mass transfer of fragments of material (which involves at least partially decomposing and/or volatilizing the binder or other additives in or under the transfer material to generate propulsive forces to propel the colorant toward the receptor). Laser ablation mass transfer does not produce well-defined dots with relatively uniform thickness. Such generally continuous and relatively sharp edges produced by the system of the present invention are important for producing controlled, reproducible dot gain (changes in half tone dot size), and therefore, controlled, reproducible colors. Also, the system of the present invention includes components, such as cross linking agents and bleaching agents, that provide a more controllable dot size and more reproducible and accurate colors, as described in greater detail below.

According to the present invention, the image can be formed on a final receptor either through "direct" or "indirect" imaging. For direct imaging, the second layer is transferred to the final receptor. The surface of the second layer is placed in intimate contact with the final receptor and imagewise exposed to a laser. In the areas in which the laser beam strikes the donor element, the second layer is transferred from the donor element to the receptor element. When the donor element is subsequently removed, the imaged areas remain on the receptor element and the non-imaged areas remain on the donor clement. Multi-colored images are formed by repeating this process with different colored donors containing pigments in register with the receptor element.

For indirect imaging, the second layer of a multi-layered donor construction is transferred to an intermediate receptor element on which is coated a strippable layer of material. A reverse image is formed on the intermediate receptor element by means of a laser-induced transfer of the second layer to the intermediate receptor element, which is in intimate contact, as described above for direct transfer. Multi-colored images are formed by repeating this process with different colored donors containing pigments in register with the intermediate receptor. When all the desired colored images have been transferred to the intermediate receptor element, then the multi-colored image, along with associated strippable layers, are transferred from the intermediate receptor element to a final receptor element.

Conventional color measurement, as defined by the Commission Internationale de l'Eclairage (CIE) in CIE Publication 15.2, *Colorimetry*, Vienna, 1986, is based upon measuring the reflectance of a surface and calculating parameters which represent the appearance of that surface under a particular set of viewing conditions. See e.g. A. Gilchrist, *Characterising Special-effect Colours,* 85, B4 SURFACE COATINGS INTERNATIONAL, PART B: COATING TRANSACTIONS, at 281–85 (November 2002). When measuring gonio-apparent colors, the color perceived depends upon the geometry of the measurement. Thus, a widely used approach is to take several measurements at different angles in order to characterize the gonio-apparent effect. Du Pont patented the use of a set of angles 15°/45°/110° (U.S. Pat. No. 4,479,718 (Alman)) for characterization of the metallic-effect colors and Alman developed an equation for the "flop index" used to compare the flop effect of different metallic paint samples. The "flop index" is a useful measure for metallic-effect colors, but it still concerns only a one-dimensional scale. Plus, while several commercially-available instruments have been developed based on multi-angle measurement, there is still no agreed upon standard geometry for measurement and therefore measurements taken on different instruments cannot be compared. Thus, visual assessment of the metallic effect is still used to compare and characterize metallic images made using different formulations and technologies. Characterization and comparison of the present invention involved visual inspection and classification based upon the amount of luster or sparkle of the metallic image. For example, a description of "flat" is used to indicate low levels of metallic sparkle while "brilliant" indicates high levels of metallic sparkle. Further, the visual inspection focused on whether the metallic image had a "discontinuous grainy" image or whether the metallic image was "continuous," which would result in a more acceptable halftone color proof. The continuity can be expressed in terms of resolution. For instance, the resolution of the transferred image resulting from the system of the present invention is at least about 300 dots per inch. In another embodiment of the present invention the resolution is at least about 1000 dots per inch, and even higher resolution is possible. Thus, in one embodiment of the present invention, the metallic image has a continuous, brilliant appearance. In another embodiment, the metallic image is less continuous, thereby presenting a more grainy appearance, but is still more brilliant with greater sparkle than comparison metallic images generated using only a single layer metallic donor. Therefore, the system of the present invention is capable of producing contract quality metallic half tone color proofs.

Also, the system of the present invention is capable of producing high quality images at relatively low laser fluences (the energy delivered per unit time), thereby resulting in enhanced sensitivity. The multi-layer donor construction also facilitates the transfer of the non-volatile bulk metallic flakes at relatively low laser fluences. Preferably, the sensitivity (the lowest laser fluence required for transfer) of the system of the present invention is no greater than about 0.5 Joule/$cm^2$. In another embodiment the sensitivity is no greater than about 0.3 Joule/$cm^2$ or no greater than about 0.25 Joule/$cm^2$. This is significant because higher laser fluences (greater than 0.75 Joule/$cm^2$) can produce reduced image quality as a result of ablative transfer, even without a decomposable binder.

The multi-layer donor construction also contributes to the production of high quality images at relatively high through-put rates. For example, a proof using four colors and metallic specialty pigments can be made using the system of the present invention in about 24 minutes.

Donor Element

The donor element (i.e., donor) of the present invention typically includes a substrate coated with transfer material in the form of a multi-layer construction donor element. The donor element has at least two layers.

In all embodiments, a first layer is coated on one side of the substrate. The first layer includes at least a first donor binder and a cationic infrared absorbing dye, both of which are described in detail below. The first layer may also include a first layer crosslinking agent and a first layer crosslinking catalyst that react upon drying and heating of the first layer coating. Optional components further include coating aids such as a fluorocarbon surfactant. The second layer is coated on the first layer. The second layer and the first layer coating remain independent and do not mix to a great extent. The second layer includes at least a second donor binder, a cationic infrared absorbing dye, a second layer crosslinking agent, a fluorocarbon additive, and metallic flakes, all of which are described in detail below. In contrast to the first layer crosslinking agent, the second layer crosslinking agent reacts upon exposure to laser thermal energy. Optional components for the second layer include a dispersible material such as a pigment, a dispersant and coating aids, such as a fluorocarbon surfactant.

Substrate

Suitable substrates for the donor include, for example, plastic sheets and films such as polyethylene terephthalate, fluorene polyester polymers, polyethylene, polypropylene, acrylics, polyvinyl chloride and copolymers thereof, and hydrolyzed and non-hydrolyzed cellulose acetate. The substrate needs to be sufficiently transparent to the imaging radiation emitted by the laser or laser diode to effect thermal transfer of the corresponding image to a receptor sheet. In one embodiment of the present invention the substrate for the donor is a polyethylene terephthalate sheet. Typically, the polyethylene terephthalate sheet is from about 20 to 200 $\mu$m thick. If necessary, the substrate may be surface-treated so as to modify its wetability and adhesion to subsequently applied coatings. Such surface treatments include corona discharge treatment and the application of subbing layers or release layers.

The surface of the donor element exposed to laser radiation may include a microstructure surface to reduce the formation of optical interference patterns, although significantly this has not been a problem with the system of the present invention. The microstructure surface may be composed of a plurality of randomly positioned discrete protuberances of varying heights and shapes. Microstructure surfaces may be prepared by the methods described in U.S. Pat. Nos. 4,340,276 (Maffitt), U.S. Pat. No. 4,190,321 (Dorer), and U.S. Pat. No. 4,252,843 (Dorer).

Donor Binder

First Donor Binder

The first donor binder comprises a binder that is a hydroxylic polymer (a polymer having a plurality of hydroxy groups). In one embodiment of the present invention, 100% of the binder is a hydroxylic polymer. Prior to exposure to laser radiation, the first donor layer should be in the form of a smooth, tack-free coating, with sufficient cohesive strength and durability to resist damage by abrasion, peeling, flaking, dusting, etc., in the course of normal handling and storage. If the hydroxylic polymer is the sole or major component of (he binder, then its physical and chemical properties should be compatible with the above requirements. Thus, film-forming polymers with glass transition temperatures higher than ambient temperatures are preferred. The hydroxylic polymers should be capable of dissolving or dispersing the other components of the transfer material, and should themselves be soluble in the typical coating solvents such as lower alcohols, ketones, ethers, hydrocarbons, haloalkanes or mixtures thereof.

The hydroxy groups may be alcoholic groups, phenolic groups or mixtures thereof. In one embodiment of the present invention the hydroxy groups are alcoholic groups. The requisite hydroxy groups may be incorporated by polymerization or copolymerization of hydroxy-functional monomers such as alkyl alcohol and hydroxyalkyl acrylates or methacrylates, or by chemical conversion of preformed polymers, such as by hydrolysis of polymers and copolymers of vinyl esters such as vinyl acetate. Polymers with a high degree of hydroxy functionality (also referred to as hydroxy functional polymers), such as poly(vinyl alcohol) and cellulose are suitable for use in the invention. Derivatives of these hydroxy functional polymers generally exhibit superior solubility and film-forming properties, and provided that at least a minor proportion of the hydroxy groups remain unreacted, they are also suitable for use in the invention. In one embodiment of the present invention the hydroxylic polymer for use in the invention belongs is a derivative of a hydroxy functional polymer and is the product formed by reacting poly(vinyl alcohol) with butyraldehyde; namely polyvinyl butyral. Commercial grades of polyvinyl butyral typically have at least 5% of the hydroxy groups unreacted (free) and are soluble in common organic solvents and have excellent film-forming and pigment-dispersing properties. One suitable polyvinyl butyral binder is available under the trade designation BUTVAR B-72 from Solutia, Inc., St. Louis, Mo. This binder includes from about 17.5 to 20% free hydroxyl groups, has a Tg of from about 72° C. to 78° C. and a flow temperature at 1000 psi of from about 145° C. to 155° C.

Although such polyvinyl butyral binders are not typically used in crosslinking reactions, in an alternative embodiment of the present invention the BUTVAR B-72 polyvinyl butyral is crosslinked. This is accomplished by adding a first layer crosslinking agent such as the Desmodur aromatic polyisocyanate crosslinker available under the trade designation DESMODUR CB55N and a first layer crosslinking catalyst such as dibutyltin dilaureate into the first layer. The crosslinking reaction is maximized upon drying and baking of the coated layer.

In another embodiment of the present invention, a blend of one or more noncrosslinkable polymers may be used. The noncrosslinkable polymer typically provides the requisite film-forming properties, which may enable the use of lower molecular weight polyols. Such polymers should be nonreactive when exposed to laser radiation during imaging of the present invention. Suitable such polymers include, for example, polyesters, polyamides, polycarbamates, polyolefins, polystyrenes, polyethers, polyvinyl ethers, polyvinyl esters, polyacrylates, and polymethacrylates. Some examples of suitable noncrosslinkable polymers include, for example, polymethyl methacrylate, such as that available under the trade designation ELVACITE from DuPont, Wilmington, Del. Polymers that decompose when exposed to laser radiation during imaging are less desirable, although not entirely unusable. For example, polymers and copolymers of vinyl chloride are less desirable because they can decompose to release chlorine, which leads to discoloration and problems with accurate color match.

In one embodiment of the present invention, the hydroxylic polymer is present in an amount of about 50 wt-% to about 95 wt-% based on the total weight of the first donor binder.

Second Donor Binder

The second donor binder comprises a crosslinkable binder, which is a hydroxylic polymer. In one embodiment of the present invention, 100% of the binder is a hydroxylic polymer. The second donor layer should be in the form of a smooth, tack-free coating, with sufficient cohesive strength and durability to resist damage by abrasion, peeling, flaking, dusting, etc., in the course of normal handling and storage. If the hydroxylic polymer is the sole or major component of the binder, then its physical and chemical properties should be compatible with the above requirements. Thus, film-forming hydroxylic polymers with glass transition temperatures higher than ambient temperatures are preferred. The hydroxylic polymers should be capable of dissolving or dispersing the other components of the transfer material, and should themselves be soluble in the typical coating solvents such as lower alcohols, ketones, ethers, hydrocarbons, or haloalkanes.

The hydroxy groups may be alcoholic groups, phenolic groups or mixtures thereof. In one embodiment of the present invention the hydroxy groups are alcoholic groups. The requisite hydroxy groups may be incorporated by polymerization or copolymerization of hydroxy-functional monomers such as alkyl alcohol and hydroxyalkyl acrylates or methacrylates, or by chemical conversion of preformed polymers, such as by hydrolysis of polymers and copolymers of vinyl esters such as vinyl acetate. Polymers with a high degree of hydroxy functionality (also referred to as hydroxy functional polymers), such as poly(vinyl alcohol) and cellulose are suitable for use in the invention. Derivatives of these hydroxy functional polymers generally exhibit superior solubility and film-forming properties, and provided that at least a minor proportion of the hydroxy groups remain unreacted, they are also suitable for use in the invention. In one embodiment of the present invention the hydroxylic polymer for use in the invention belongs is a derivative of a hydroxy functional polymer and is the product formed by reacting poly(vinyl alcohol) with butyraldehyde; namely polyvinyl butyral. Commercial grades of polyvinyl butyral typically have at least 5% of the hydroxy groups unreacted (free) and are soluble in common organic solvents and have excellent film-forming and pigment-dispersing properties. One suitable polyvinyl butyral binder is available under the trade designation BUTVAR B-76 from Solutia, Inc., St. Louis, Mo. This binder includes from about 11 to 13% free hydroxyl groups, has a Tg of from about 62° C. to 72° C. and a flow temperature at 1000 psi of from about 110° C. to 115° C. Other hydroxylic binders from the BUTVAR series of polymers may be used in place of the BUTVAR B-76. These include, for example, other polyvinyl butyral binders available under the trade designations BUTVAR B-79 from Solutia, Inc. Still others are MOWITAL B30T from Hoechst Celanese, Chatham, N.J. The various products typically vary with respect to the amount of free hydroxyl groups. For example BUTVAR B-76 polyvinyl butyral includes less than about 13-mole % free hydroxy groups, whereas MOWITAL B30T polyvinyl butyral includes about 30% free hydroxy groups. Although such polyvinyl butyral binders are not typically used in crosslinking reactions, in the system of the present invention it is believed that the BUTVAR B-76 polyvinyl butyral crosslinks with the second layer crosslinking agent described below.

Alternatively, a blend of one or more noncrosslinkable polymers with one or more crosslinkable hydroxylic polymers may be used. The noncrosslinkable polymer typically provides the requisite film-forming properties, which may enable the use of lower molecular weight polyols. Such polymers should be nonreactive when exposed to the laser radiation used during imaging of the present invention. Suitable such polymers include, for example, polyesters, polyamides, polycarbamates, polyolefins, polystyrenes, polyethers, polyvinyl ethers, polyvinyl esters, polyacrylates, and polymethacrylates. Suitable noncrosslinkable polymers that can be combined with the crosslinkable hydroxylic polymer described above in the transfer material include, for example, polymethyl methacrylate, such as that available under the trade designation ELVACITE from DuPont, Wilmington, Del. Whether crosslinkable or noncrosslinkable, polymers that decompose upon exposure to laser radiation during imaging are less desirable, although not entirely unusable. For example, polymers and copolymers of vinyl chloride are less desirable because they can decompose to release chlorine, which leads to discoloration and problems with accurate color match.

In one embodiment of the present invention, the hydroxylic polymer is present in an amount of about 10 wt-% to about 35 wt-% based on the total weight of the second donor binder.

Cationic Infrared Absorbing Dye

The cationic infrared absorbing dye (also referred to as an cationic IR absorbing dye, a cationic IR dye or a photothermal converting dye) used in the system of the present invention is a light-to-heat converter. Cationic infrared absorbing dyes produce transparent films when combined with the binder polymers and other components of the donor material described herein. In contrast, neutral dyes, such as squarylium and croconium dyes, produce dispersion aggregates resulting in coatings with visible agglomerated pigments. Also, anionic dyes are incompatible with the second donor layer material of the present invention, and result in flocculation of the pigment dispersion.

In one embodiment, the cationic. IR absorbing dye is a bleachable dye, meaning that it is a dye capable of being bleached. Bleaching of the dye means that there is an effective diminution of absorption bands that give rise to visible coloration of the cationic IR absorbing dye. Bleaching of the cationic IR absorbing dye may be achieved by destruction of its visible absorption bands, or by shifting them to wavelengths that do not give rise to visible coloration, for example.

Suitable cationic IR absorbing dyes for use in the second layer of the present invention are selected from the group of tetraarylpolymethine (TAPM) dyes, amine cation radical dyes, and mixtures thereof. Preferably, the dyes are the tetraarylpolymethine (TAPM) dyes. Dyes of these classes are typically found to be stable when formulated with the other ingredients of the present invention and to absorb in the correct wavelength ranges for use with the commonly available laser sources. Furthermore, the cationic IR absorbing dyes of the present invention are believed to react with the crosslinking agent in the second layer, described below, when photoexcited by laser radiation. This reaction not only contributes to bleaching of the cationic infrared absorbing dye, but also leads to crosslinking of the second donor binder, as described in greater detail below. Yet another useful property shown by many of these cationic IR absorbing dyes is the ability to undergo thermal bleaching by nucleophilic compounds and reducing agents that may be incorporated in the receptor, as is also described in greater detail below.

TAPM dyes comprise a polymethine chain having an odd number of carbon atoms (5 or more), each terminal carbon atom of the chain being linked to two aryl substituents. These generally absorb in the 700 nm to 900 nm region. There are several references in the literature to their use as cationic IR absorbing dyes when exposed to laser radiation, e.g., JP Publication Nos. 63-319191 (Showa Denko) and 63-319192 (Shonia Denko), U.S. Pat. No. 4,950,639 (DeBoer), and EP 602 893 (3M) and 0 675 003 (3M). When these cationic IR absorbing dyes are co-transferred with pigment, a blue cast is given to the transferred image because the TAPM dyes generally have absorption peaks that tail into the red region of the spectrum. However, this problem is solved by means of the bleaching processes described in greater detail below.

In one embodiment of the present invention the dyes of the TAPM class have a nucleus of formula (I):

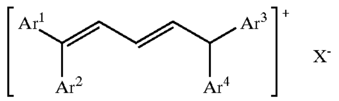

wherein each $Ar^1$, $Ar^2$, $Ar^3$ and $Ar^4$ is aryl and at least one (and more preferably at least two) aryl has a cationic amino substituent (preferably in the 4-position), and X is an anion. Preferably no more than three (and more preferably no more than two) of said aryl bear a tertiary amino group. The aryl bearing said tertiary amino groups are preferably attached to different ends of the polymethine chain ($Ar^1$ or $Ar^2$ and $Ar^3$ or $Ar^4$ have tertiary amino groups).

Examples of tertiary amino groups include dialkylamino groups (such as dimethylamino, diethylamino, etc.), diarylamino groups (such as diphenylamino), alkylarylamino groups (such as N-methylanilino), and heterocyclic groups such as pyrrolidino, morpholino, or piperidino. The tertiary amino group may form part of a fused ring system.

The aryl groups represented by $Ar^1$ to $Ar^4$ may comprise phenyl, naphthyl, or other fused ring systems, but phenyl rings are preferred. In addition to the tertiary amino groups discussed previously, substituents which may be present on the rings include alkyl groups (preferably of up to 10 carbon atoms), halogen atoms (such as Cl, Br, etc.), hydroxy groups, thioether groups and alkoxy groups. In another embodiment of the present invention, substituents such as alkoxy groups donate electron density to the conjugated system. Substituents, especially alkyl groups of up to 10 carbon atoms or aryl groups of up to 10 ring atoms, may also be present on the polymethine chain.

In one embodiment of the present invention, the anion (X) is derived from a strong acid and HX should have a pKa of less than 3 or less than 1. Suitable identities for X include $ClO_4$, $BF_4$, $CF_3SO_3$, $PF_6$, $AsF_6$, $SbF_6$ and perfluoroethylcyclohexylsulphonate.

Cationic polymethine dyes that can be bleached by reacting with various bleaching agents used in another embodiment of the invention have the following structures:

Formula (II)

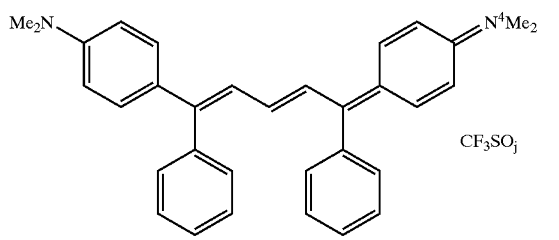

Formula (III)

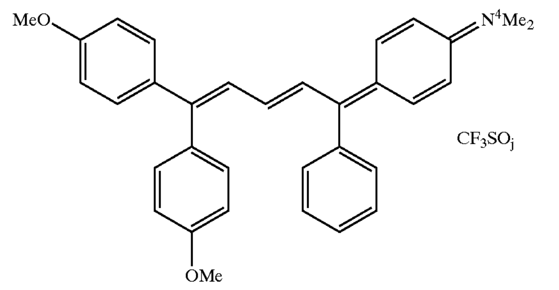

The TAPM dyes of formula (I) may be synthesized by known methods, such as by conversion of the appropriate benzophenones to the corresponding 1,1-diarylethylenes (by the Wittig reaction, for example), followed by reaction with a trialkyl orthoester in the presence of strong acid HX.

Alternative cationic infrared absorbing dyes, although not as readily bleached as the TAPM dyes, include the class of amine cation radical dyes (also known as immonium dyes) disclosed, for example, in International Publication No. WO 90/12342 and JP Publication No. 51-88016 (Canon). Included in this class of amine cation radical dyes are the diamine dication radical dyes (in which the chromophore bears a double positive charge), exemplified by materials such as CYASORB IR 165, commercially available from Glendale Protective Technologies Inc., Lakeland, Fla. Such diamine dication radical dyes have a nucleus of the following general formula (IV):

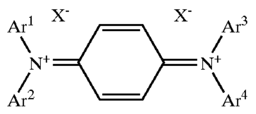

in which $Ar^1$–$Ar^4$ and X are as defined above. Diamine dication radical dyes typically absorb over a broad range of wavelengths in the near infrared region, making them suitable for address by YAG lasers as well as diode lasers. Although diamine dication radical dyes show peak absorption at relatively long wavelengths (approximately 1050 nm, suitable for YAG laser address), the absorption band is broad and tails into the red region, which gives a blue cast to the transferred image. As discussed above, this problem is solved by means of a bleaching process described in greater detail below.

The bleachable cationic infrared absorbing dye is present in a sufficient quantity to provide a transmission optical density of at least about 0.5, at the exposing wavelength. In an alternative embodiment the cationic IR absorbing dye is present in a sufficient quantity to provide a transmission optical density of at least about 0.75, at the exposing wavelength. In yet another embodiment, the cationic IR absorbing dye is present in a sufficient quantity to provide a transmission optical density of at least about 1.0, at the exposing wavelength. Typically, this is accomplished with about 3 wt-% to about 20 wt-% cationic IR absorbing dye, based on the dry coating weight of the donor material.

First Layer Crosslinking Agent

In one embodiment of the present invention the first layer is crosslinked. This is accomplished by adding a first layer crosslinking agent such as the Desmodur aromatic polyisocyanate crosslinker available under the trade designation DESMODUR CB55N and a first layer crosslinking catalyst such as dibutyltin dilaureate to the first donor binder and subjecting the coated layer to drying and baking. The crosslinking reaction is maximized by placing the coated material is baking conditions of about 190° F. for from about 2 to 4 hours.

Alternative first layer crosslinking agents that may be used in the present invention include, for example, CYMEL 1133 from Cytec Industries, West Paterson, N.J., Phenolic Crosslinker GPRI7571 from Georgia Pacific Resins Inc., Atlanta, Ga., and RESIMENE 717 from UCB Surface Specialties, St. Louis, Mo.

In one embodiment of the present invention, the crosslinking agent is present in an amount of about 26 to 50 wt % based on the total weight of the first donor binder.

The crosslinking effect also prevents migration of the metallic flakes towards or potentially into the first layer from the second layer.

Second Layer Latent Crosslinking Agent

The second layer crosslinking agent of the present invention is a compound having a nucleus of formula (V):

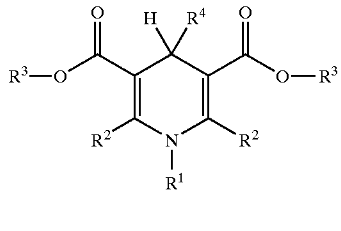

wherein: $R^1$ is hydrogen or an organic group, and each of $R^2$ and $R^3$ is an organic group, and $R^4$ is aryl. Each of $R^1$, $R^2$, and $R^3$ can be a polymeric group. That is, these can be a site by which compounds having the nucleus of formula (V) form polymers, as long as the carbonyl groups arc available for interaction with the second donor layer hydroxylic polymer binder. Preferably, $R^1$ is selected from the group of hydrogen, an alkyl group, a cycloalkyl group, and an aryl group (more preferably, $R^1$ is selected from the group of an alkyl group, a cycloalkyl group, and an aryl group); each $R^2$ and $R^3$ is independently an alkyl group or an aryl group; and $R^4$ is an aryl group.

The second layer crosslinking agent is used in an amount of from about 1 to 5 wt %, based on the total weight of the second layer donor element material. The second layer crosslinking agent may also be used in the receptor element. As used herein, the second layer crosslinking agent is one that is typically only reactive in the system when exposed to laser radiation.

The crosslinking effect during laser imaging results in a high quality transferred dot formed of a metallic film with well-defined, generally continuous, and relatively sharp edges. It also prevents retransfer of the metallic flake back to the donor, as well as back transfer of the metallic flake to the donor in a subsequent imaging step. This greatly simplifies the imaging process, as well as yielding more controllable film transfer.

In one embodiment of the present invention, $R^1$ in formula (V) is any group compatible with formation of a stable pyridinium cation, which includes essentially any alkyl, cycloalkyl or aryl group. Alternatively, for reasons of cost and convenience, lower alkyl groups having 1 to 5 carbon atoms (such as methyl, ethyl, or propyl) or simple aryl groups (such as phenyl or tolyl). Similarly, $R^2$ may represent essentially any alkyl or aryl group. Alternatively, lower alkyl groups of 1 to 5 carbon atoms (such as methyl or ethyl) may be selected for reasons of cost and ease of synthesis. $R^3$ may also represent any alkyl or aryl group such that the corresponding alcohol or phenol, $R^3OH$, is a good leaving group, as this promotes the transesterification reaction believed to be central to the curing mechanism. Thus, in one embodiment of the present invention, aryl groups comprising one or more electron-attracting substituents such as nitro, cyano, or fluorinated substituents, or alkyl groups of up to 10 carbon atoms are selected. In another embodiment of the present invention, each $R^3$ represents lower alkyl group such as methyl, ethyl, propyl etc, such that $R^3OH$ is volatile at temperatures of about 100° C. and above. $R^4$ may represent any aryl group such as phenyl, naphthyl, etc., including substituted derivatives thereof, but is most conveniently phenyl.

Analogous compounds in which $R^4$ represents hydrogen or an alkyl group are not suitable for use in the donor element of the invention, because such compounds react at ambient or moderately elevated temperatures with many of the cationic infrared absorbing dyes suitable for use in the present invention, and hence the compositions have a limited shelf life. In contrast, the compounds in which $R^4$ is an aryl group are stable towards the cationic IR absorbing dyes in their ground state, and the compositions have a good shelf life. The analogous compounds in which $R^4$ represents hydrogen or an alkyl group may, however, be incorporated in the receptor, where their thermal bleaching action towards the cationic infrared absorbing dye is beneficial.

Significantly, because the second layer crosslinking agent can also act as a bleaching agent, it helps control the heat generated during imaging. That is, the second layer crosslinking agent helps bleach out the cationic infrared absorbing dye, thereby quenching absorption and moderating any tendency for runaway temperature rises, which could possibly cause ablation of the coating.

Such dihydropyridines can be prepared by known methods, such as by an adaptation of the Hantsch pyridine synthesis. One second layer crosslinking agent used in the present invention is an N-phenyldihydropyridine-derived compound of formula (V-a):

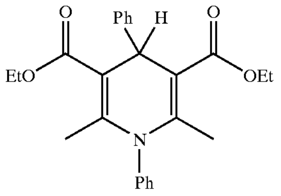

Fluorocarbon Additive

The second layer also includes a fluorocarbon additive for enhancing transfer of a molten or softened film and production of half tone dots (pixels) having well-defined, generally continuous, and relatively sharp edges. Under the conditions used to prepare images using the system of the present invention, the fluorocarbon additive serves to reduce the cohesive forces within the second layer at the interface between the areas exposed to laser radiation and the areas not exposed to laser radiation and thereby promotes clean "shearing" of the second layer in the direction perpendicular to its major surface. This provides improved integrity of the dots with sharper edges, as there is less tendency for "tearing" or other distortion as the transferred dots separate from the rest of the second layer. Thus, unlike dye transfer systems in which just the colorant is transferred, and unlike ablation transfer systems in which gases arc typically formed that propel the colorant toward the receptor, the system of the present invention forms images by transfer of the metallic flake, binder, pigment, and other additives, in a molten or softened state as a result of a change in cohesive forces. The change in cohesive forces assists in limiting the domain of the transferred material, thus, providing more control of the dot size.

As stated in the background, an effect of the propulsive forces in an ablative system, however they are formed, is a tendency for the colorant to "scatter," producing less well-defined dots made of fragments. In contrast, the system of the present invention produces dots formed from and transferred as a molten or softened film of material (binder, metallic flakes, pigment, and additives). It is believed that the fluorocarbon additive promotes controllable flow of the material from the second layer in a molten or softened state. This mechanism is similar to what occurs in conventional thermally induced wax transfer systems, however, the molten or softened material of the second layer of the present invention does not uncontrollably wick across to the receptor and spread over the surface of the receptor. Rather, the system of the present invention involves a more controlled mechanism in which the material melts or softens and transfers. This controlled mechanism results in reduced dot gain and high resolution, relative to thermally induced wax transfer systems.

A wide variety of compounds may be used as the fluorocarbon additive provided they are substantially involatile under normal coating and drying conditions, and sufficiently miscible with the binder material(s). Thus, highly insoluble fluorocarbons, such as polytetrafluoroethylene and polyvinylidenefluoride, are unsuitable, as are gases and low boiling liquids, such as perfluoralkanes. With the above exceptions, both polymeric and lower molecular weight materials may be used. In one embodiment of the present invention, the fluorocarbon additive is selected from compounds comprising a fluoroaliphatic group attached to a polar group or moiety and fluoropolymers having a molecular weight of at least about 750 and comprising a non-fluorinated polymeric backbone having a plurality of pendant fluoroaliphatic groups, which aliphatic groups comprise the higher of: (a) a minimum of three CF bonds; or (b) in which 25% of the CH bonds have been replaced by CF bonds such that the fluorochemical comprises at least 15% by weight of fluorine.

Suitable fluorocarbon additives are disclosed in EP 602 893 (3M) and the references cited therein. In one embodiment of the present invention, the fluorocarbon additive is a sulfonamido compound $(C_8F_{17})SO_2\,NH(CH_2\,CH_3)$ (N-ethyl perfluorooctanesulfonamide), which includes 70% straight chains and 30% branched chains. The fluorocarbon additive is typically used in an amount of about 0.5 to 5 wt %, based on the total coating weight of the second layer.

Metallic Flake

Metallic pigments are generally composed of flakes of aluminum metal. The metallic flakes are in effect two-dimensional objects, which function as tiny mirrors in the coating material, and reflect light preferentially near the 'specular' or gloss angle. At angles remote from the specular angle much less light is reflected, leading to the change in lightness perceived as the angle of viewing is altered. This change is commonly known as the 'flop' effect of metallic pigments.

Unlike commonly used process color pigments, which are roughly spherical, evenly dispersed and small relative to the imaging dot size, the metallic flakes used in the present invention are true flakes that make up a significant fraction of the imaging dot size. The metallic flakes are also irregularly shaped. The size of the flakes used in the present invention may range from 7 microns to 24 microns. In an alternative embodiment the flakes of aluminum metal have a typical thickness of about 0.1 to 1.0 micron and a typical length of about 7 to 45 microns. In comparison, typical process color pigment particle sizes are generally less than 1 micron, ranging from about 0.05 to 1 micron.

Aluminum flake pigments are almost exclusively made by one of two processes: the more common Hall process (U.S. Pat. No. 1,501,499) and the more specialized Levine process (U.S. Pat. No. 4,321,087). Common lithographic inks predominantly feature the Hall process pigments.

The metallic flakes come as one of two broad types: leafing and non-leafing. Leafing pigments are coated during manufacture with a fatty acid, typically stearic acid, which renders the flake surface active. This causes the flakes to align with the vehicle surface during application thereby giving the laminar structure necessary for specular reflectivity. Non-leafing pigments are not surface active and generally rely on larger size and/or lateral shear during application to generate a laminar structure. Even with leafing pigments the typical minimum weight average particle size is about 8 microns. A side effect of selecting a leafing pigment is that the formulation cannot employ a solvent that solubilizes stearic acid. Generally this limits the choice to either polar, protic solvents such as alcohols or apolar, aprotic solvents such as aliphatic or aromatic hydrocarbons.

The metallic flake is present in a sufficient quantity to provide an acceptable visual effect. Typically, this is accomplished with about 20 wt % to about 50 wt % of metallic flake pigment, based on the dry coating weight of the second layer of the donor material.

In one embodiment of the present invention the metallic flake is suspended as an aluminum paste available under the trade designation SPARKLE SILVER PREMIER (SSP) 554 from Silberline Manufacturing Co. Inc. located in Tamaqua, Pa. This particular aluminum flake is a non-leafing aluminum flake and is characterized as a 400 Mesh Grade and has a 99.99% minimum through a 325 mesh screen. Preparation of the aluminum paste involves adding a sufficient amount of solvent (1/3 to 1/2 the weight of the aluminum paste) to the aluminum paste to develop a thick creamy consistency under slow-speed mixing. After the development of a smooth, lump-free pigment slurry total letdown can be completed with remaining solvent and vehicle. Other aluminum pastes may be used in place of the SSP 554. These include, for example, other aluminum pastes available under the trade designations of SSP 353, ETERNABRITE 651 and SPARKLE BRITE PREMIER from Silberline.

In alternative embodiments of the present invention mica flakes or a combination of mica and aluminum flakes may be used. Mica pigments are composed of flakes of naturally occurring mica. These flakes are coated with a smooth, thin layer of an inorganic oxide (usually titanium dioxide, although iron and chromic oxides are also used) which leads to multiple reflections of light within and from the layered material. Interference takes place between these reflected light beams, leading to preferential reflection of particular colors at particular angles. This interference effect is the basis of the "color flop" seen with mica pigments. In one embodiment the mica flake is available under the trade designation AFFLAIR PEARL-LUSTRE PIGMENTS from EM Industries, Inc. located in New York, N.Y. Mica flakes are also available from Degussa Corp., located in Parsippany, N.J. as PEARLESCENT SILVER.

Dispersible Material

The dispersible material (also referred to as the "dispersed" material when dispersed within the second layer) is a particulate material that is of sufficiently small particle size that it can be dispersed within the second layer, with or without the aid of a dispersant. Suitable dispersible materials for use in the second layer typically include colorants such as pigments and crystalline nonsublimable dyes. The pigment(s) or nonsublimable dye(s) in the second layer are those typically used in the printing industry. Thus, the dispersible materials may be of a variety of hues. Alternatively, the dispersible materials may not necessarily add color but simply enhance the color or they may be clear or colorless and provide a texturized image.

Essentially any dye, pigment or mixture of dyes and/or pigments of the desired hue may be used as a dispersible material in the second layer. They are generally insoluble in the second layer composition and are nonsublimable under imaging conditions at atmospheric pressures. They should also be substantially unreactive with the bleaching agent in the receptor under both ambient conditions and during the imaging process.

Dispersible materials that enhance color include, for example, fluorescent, pearlescent, iridescent, and metallic materials. Materials such as silica, polymeric beads, reflective and non-reflective glass beads, or mica may also be used as the dispersible material to provide a textured image. Such materials are typically colorless, although they may be white or have a color that does not detract from the color of the pigment, for example, and can be referred to as texturizing materials.

In one embodiment of the present invention, pigments and crystalline nonsublimable polymeric dyes are used because they have a lower tendency for migration between the first layer and second layer. Further, pigments are used due to the wide variety of colors available, their lower cost, and their greater correlation to printing inks. Pigments in the form of dispersions of solid particles typically have a much greater resistance to bleaching or fading on prolonged exposure to sunlight, heat, and humidity in comparison to soluble dyes, and hence can be used to form durable images. The use of pigment dispersions in color proofing materials is well known in the art, and any of the pigments previously used for that purpose may be used in the present invention. In one embodiment of the present invention, pigments or blends of pigments matching the yellow, magenta, cyan, and black references provided by the International Prepress Proofing Association (known as the SWOP color references) are used although the invention is by no means limited to these colors. Pigments of essentially any color may be used, including those conferring special effects such as opalescence, fluorescence, UV absorption, IR absorption, and ferromagnetism, for example.

In one embodiment of the present invention the second layer of the donor element contains a sufficient amount of dispersible material to provide a reflection optical density of at least 0.4 at the relevant viewing wavelength. In another embodiment, the second layer of the donor element contains a sufficient amount of dispersible material to provide a reflection optical density of at least 0.8 at the relevant viewing wavelength. Thus, the pigment(s) or nonsublimable dye(s) are present in the second layer of the donor element in an amount of about 1 to 20 wt %, based on the total weight of the second layer of the donor element.

Pigments are generally introduced in the form of a mill-base comprising the pigment dispersed with a binder and suspended in a solvent or mixture of solvents. The dispersion process may be accomplished by a variety of methods well known in the art, such as two-roll milling, three-roll milling, sand milling, and ball milling. Many different pigments are available and are well known in the art. The pigment type and color are chosen such that the coated color proofing element is matched to a preset color target or specification set by the industry.

The type and amount of binder used in the dispersion is dependent upon the pigment type, surface treatment on the pigment, dispersing solvent, and milling process. The binder is typically the same hydroxylic polymer described above. In one embodiment of the present invention, the binder is a polyvinyl acetal such as a polyvinyl butyral available under the trade designation BUTVAR B-76 from Monsanto, St. Louis, Mo.

Optional Additives

Coating aids, dispersing agents, optical brighteners, UV absorbers, fillers, etc., can also be incorporated into the pigment mill base, or in the overall donor element composition. Dispersing agents (also referred to as dispersants) may be necessary to achieve optimum dispersion quality. Some examples of dispersing agents include, for example, polyester/polyamine copolymers, alkylarylpolyether alcohols, acrylic resins, and wetting agents. In one embodiment of the present invention the dispersant is a block copolymer with pigment affinity groups, available under the trade designation DISPERBYK 161 from Byk-Chemie USA, Wallingford, Conn. The dispersing agent is used in an amount of about 0.5 wt % to about 2 wt %, based on the dry coating weight of the pigment and binder.

Surfactants may be used to improve solution stability. A wide variety of surfactants can be used. One surfactant is a fluorocarbon surfactant used to improve coating quality. Suitable fluorocarbon surfactants include fluorinated polymers, such as the fluorinated polymers described in U.S. Pat. No. 5,380,644 (Yonkowski, et al.). In one embodiment of the present invention a surfactant is used in an amount of at least about 0.005 wt % based on the total weight of the first layer or second layer. In another embodiment the usage amount is no greater than from about 0.01 to 0.1 wt %, and typically in an amount of no greater than from about 0.1 to 0.2 wt %.

Preparation of the Donor Element

The donor element may be coated as two or more contiguous layers. In one embodiment of the present invention, the donor element has two layers. For example, the first layer is coated on top of the substrate material, and therefore lies intermediate the substrate and a distinct second layer. In this embodiment, the first layer contains at least a first donor binder and a cationic IR absorbing dye. The distinct second layer contains at least a second donor binder, a cationic IR absorbing dye, a second layer crosslinking agent, a fluorocarbon additive, metallic flakes and a dispersible material. Optional additives may also be added to both the first and second layers.

The first layer and the second layer compositions of the donor element are readily prepared by dissolving or dispersing the various components in a suitable solvent, typically an organic solvent, and coating the mixture on a substrate. The solvent is typically present in an amount of at least about 90 wt %. The organic solvent is typically an alcohol, a ketone, an ether, a hydrocarbon, a haloalkane, or mixtures thereof. Suitable solvents include, for example, methanol, ethanol, propanol, 1-methoxy ethanol, 1-methoxy-2-propanol, methyl ethyl ketone, methyl isobutyl ketone, diethylene glycol monobutyl ether (butyl CARBITOL), and the like. Typically, a mixture of solvents is used, which assists in controlling the drying rate and avoiding forming cloudy films. An example of such a mixture is methyl ethyl ketone, ethanol, and 1-methoxy propanol.

In one embodiment of the present invention, the first donor binder, BUTVAR B-72 polyvinyl butyral, has limited solubility in methyl ethyl ketone. Therefore a combination of methyl ethyl ketone and ethanol is typically used for preparation and coating of the first layer of the donor element. To prepare the second layer composition of the donor element in this embodiment, a single solvent such as methyl isobutyl ketone is chosen to prevent interactions between the first layer and the second layer. In another embodiment, when the first layer includes a first layer crosslinking agent, it is possible to use a single solvent such as methyl ethyl ketone to prepare the first layer of the donor element and the second layer of the donor element.

The metallic flakes of the second layer are most conveniently prepared by predispersing the metallic flakes in the hydroxylic polymer in roughly equal proportions by weight with solvents and dispersants. The metallic flake dispersions are typically prepared by simple mixing methods. High shear mixing should be avoided to minimize fracture of the metallic flake particles. Any of the standard coating methods may be employed, such as roller coating, knife coating, gravure coating, and bar coating, followed by drying at moderately elevated temperatures.

The relative proportions of the components of the donor element may vary widely, depending on the particular choice of ingredients and the type of imaging required. Preferred pigmented media for use in the invention have the following approximate composition (in which all percentages are based on the total weight of the layer):

| First Layer Donor Composition: | |
|---|---|
| hydroxylic polymer (e.g., BUTVAR B72 available from Solutia, Inc. St. Louis, MO) | about 35 to 95 wt % |
| cationic IR absorbing dye (e.g. PC 364 available from St. Jean Chemicals, Inc. Quebec, Canada) | about 3 to 20% |

-continued

| Second Layer Donor Composition: | |
|---|---|
| hydroxylic polymer (e.g., BUTVAR B76 available from Solutia, Inc. St. Louis, MO) | about 10 to 55 wt % |
| cationic IR absorbing dye (e.g. PC 364 available from St. Jean Chemicals, Inc. Quebec, Canada) | about 5 to 15 wt % |
| fluorochemical additive (e.g., a perfluoroalkylsulphonamide) | about 0.5 to 5 wt % |
| metallic flakes (e.g. Aluminum metallic flake available from Silberline Manufacturing Co. Inc., Tamaqua, PA) | about 20 to 50 wt % |
| colorant | about 0.5 to 30 wt % |
| pigment dispersant (e.g., DISPBRBYK 161 available from Byk-Chemie USA, Wallingford, CT) | about 0 to 1 wt % |
| IRCOGEL 960 (Rheology Control Additive available from by Lubrizol, Wickliffe, OH) | about 0 to 20 wt % |
| SANCTIZER 278 (Plasticizing agent available from Monsanto, St. Louis, MO) | about 0 to 25 wt % |
| latent crosslinking agent (e.g. HP 1186 available from St. Jean Chemicals, Inc. Quebec, Canada) | about 1 to 5 wt % |

In one embodiment of the present invention the remainder of the first layer and the second layer is solvent. In another embodiment of the present invention, the first layer crosslinking agent is present in an amount of about 26 to 50 wt % and the remainder of the first layer is solvent.

In one embodiment of the present invention, the coating weight of the first layer is from about 20 to 60 mg/ft$^2$. In another embodiment the first layer coating weight is from about 50 to 90 mg/ft$^2$. With respect to the second layer, in one embodiment of the present invention the coating weight is from about 70 to 90 mg/ft$^2$. In another embodiment, the second layer coating weight is from about 50 to 120 mg/ft$^2$.

Thin coatings of less than about 3 $\mu$m dry thickness of the second layer may be transferred to a variety of receptor sheets by exposure to laser radiation. Although primarily designed for transfer to paper or similar receptors for color proofing purposes, transfer material compositions described herein may alternatively be transferred to a wide variety of substrates.

Receptor

The receptor to which the image is transferred, whether it be an intermediate receptor in an indirect transfer or a final receptor in a direct transfer, typically includes a substrate on which is coated a receptor binder and typically a bleaching agent. In another embodiment of the present invention, the receptor includes optional additives such as particulate material, surfactants, and antioxidants. The receptor may additionally include the cationic IR absorbing dyes also used in the donor material. The final receptor used in an indirect transfer process can be any receptor that will accept the image and strippable adhesive. This includes plain paper, coated paper, glass, polymeric substrates, and a wide variety of other substrates.

In one embodiment of the present invention, the intermediate receptor consists of a polyethylene terephthalate sheet (75–150 $\mu$m thick) on which is coated a strippable layer consisting of an acrylic or a vinyl acetate adhesive. On this is coated a dispersion of a receptor binder, a bleaching agent, and particulate material to form a receiving layer. The dispersion is typically coated out of water or an organic solvent. Suitable organic solvents include those listed above to coat the first layer and second layer onto a substrate for preparation of the donor element, as well as others such as toluene, for example.

The receptor is chosen based on the particular application. Receptors may be transparent or opaque. Suitable receptors include coated paper, metals such as steel and aluminum; films or plates composed of various film-forming synthetic or high polymers including addition polymers such as poly (vinylidene chloride), poly(vinyl chloride), poly(vinyl acetate), polystyrene, polyisobutylene polymers and copolymers, and linear condensation polymers such as poly (ethylene terephthalate), poly(hexamethylene adipate), and poly(hexamethylene adipamide/adipate). The receptor may be transparent or opaque. Nontransparent receptor sheets may be diffusely reflecting or specularly reflecting.

In one embodiment of the present invention, the receptor comprises a texturized surface. That is, the receptor includes a support bearing a plurality of protrusions. The protrusions can be obtained in a variety of ways. For example, particulate material may be used to form the protrusions. Alternatively, the support may be microreplicated, thereby forming the protrusions. This is discussed in greater detail below.

For color imaging, the receptor may include paper (plain or coated) or a plastic film coated with a thermoplastic receiving layer. The thermoplastic receiving layer is typically several micrometers thick and may comprise a thermoplastic resin capable of providing a tack-free surface at ambient temperatures, and which is compatible with the portions of the second layer transferred to the receptor. The receptor may advantageously contain a bleaching agent for the cationic IR absorbing dye, as taught in EP 675 003. Bleaching agents for use in the system of the present invention are discussed below.

A suitable receptor layer comprises PLIOLITE S5A containing diphenylguanidine as a bleaching agent in an amount of from about 2 to 25 wt % of the receptor element and 8 $\mu$m diameter beads of poly(stearyl methacrylate) in an amount of from about 0.2 to 2.5 wt % of total solids, coated at about 5.9 g/m$^2$. Alternatively, the receptor layer comprises BUTVAR-B76. The hydroxylic polymer binder is present in an amount of from about 70 to 90 wt % based on the total weight of the receptor layer.

Texturizing Material

The receptor may be textured with particulate material or otherwise engineered so as to present a surface having a controlled degree of roughness. That is, the receptor of the present invention includes a support bearing a plurality of protrusions that project above the outer surface of the receptor substrate. The protrusions may be created by incorporating polymer beads or silica particles, for instance, in a binder to form a receiving layer, as disclosed, for example, in U.S. Pat. No. 4,876,235 (DeBoer). Microreplication may also be used to create the protrusions, as disclosed in EP 382 420 (3M).

When one (or both) of the donor and receptor sheets presents a roughened surface, vacuum draw-down of the one to the other is facilitated. Although the use of particulate material in color proof systems is known, as disclosed in U.S. Pat. No. 4,885,225 (Heller, et al.), for example, it has been discovered that the protrusions on the receptor significantly enhance transfer of the second layer of the present invention and thereby the image quality. Without such protrusions in (or on) the receptor surface, there can be a tendency for dust artifacts and mottle to result in small areas (approximately 1 mm) of no image transfer.

The protrusions in the receptor regulate precisely the relationship between the donor and the receptor. That is, the protrusions are believed to provide channels for air that would otherwise be trapped between the donor and receptor to escape so there is uniform contact between the donor and the receptor over the entire area, which is otherwise impossible to achieve for large images. More importantly, the protrusions are believed to prevent entrapment of air in the transferred imaged areas. As the molten or softened film transfers to the receptor in a given area the air can escape through the channels formed by the protrusions.

The protrusions provide a generally uniform gap between the donor and the receptor, which is important for effective film transfer. The gap is not so large that ablative transfer occurs during imaging upon exposure to laser radiation. Preferably, the protrusions are formed from inert particulate material, such as polymeric beads.

The beads or other particles may be of essentially uniform size (a monodisperse population) or may vary in size. Dispersions of inorganic particles such as silica generally have a range of particle sizes, whereas monodisperse suspensions of polymer beads are readily available. The particles should not project above the surface of the receptor substrate by more than about 8 μm on average, but should project above the surface of the receptor substrate by at least about 1 μm, or alternatively by at least about 3 μm. The composition of the polymeric beads is generally chosen such that substantially all of the visible wavelengths (400 nm to 700 nm) are transmitted through the material to provide optical transparency. Nonlimiting examples of polymeric beads that have excellent optical transparency include polymethylmethacrylate and polystearyl methacrylate beads, described in U.S. Pat. No. 2,701,245 (Lynn); and beads comprising diol dimethacrylate homopolymers or copolymers of these diol dimethacrylates with long chain fatty alcohol esters of methacrylic acid and/or ethylenically unsaturated comonomers, such as stearyl methacrylate/hexanediol diacrylate crosslinked beads, as described in U.S. Pat. Nos. 5,238,736 (Tseng, et al.) and U.S. Pat. No. 5,310,595 (Ali, et al.).

The shape, surface characteristics, concentration, size, and size distribution of the polymeric beads are selected to optimize performance of the transfer process. The smoothness of the bead surface and shape of the bead may be chosen such that the amount of reflected visible wavelength (400 nm to 700 nm) of light is kept to a minimum. This may or may not be an issue depending upon the actual substrate used. For example, if the color proof is formed on a transparent substrate, the haze introduced by the presence of the beads may be effected by the color. The shape of the beads can be spherical, oblong, ovoid, or elliptical. In some constructions, it is advantageous to add two distinct sets of beads with different average sizes. This allows the flexibility to balance haze with slip or separation characteristics.

The optimum particle size depends on a number of factors, including the thickness of the receptor, the thickness of the second layer of the donor element, and the number of layers to be transferred to a given receptor. In the case of transfer of two or more layers to a single receptor, the projections provided by the particles must be great enough not to be obscured by the first layer(s) transferred thereto. If the average projection is significantly greater than about 8 μm, however, transfer of the transfer material as a coherent film becomes generally impossible, and the quality of the transferred image deteriorates markedly.

In the case of polydisperse populations of particles, such as silica particles, excellent results have been obtained when the largest of said particles project above the surface of the receptor substrate by about 4 μm.

As an alternative to the use of beads or particles the receptor surface may be physically textured to provide the required protrusions. Metal surfaces, such as aluminum, may be textured by graining and anodizing. Other textured surfaces may be obtained by microreplication techniques, such as those disclosed in EP 382 420 (3M).

The extent of the protrusions on the receptor surface, whether formed by bead, particles, or texturing, may be measured, for example, by interferometry or by examination of the surface using an optical or electron microscope.

An example of a final receptor for direct imaging is the MATCHPRINT Low Gain Commercial Base manufactured by Schoeller Technical Paper Sales, Inc. of Pulaski, N.Y. This receptor is a heat stable, waterproof material that includes a paper sheet sandwiched between two polyethylene layers.

Binder

The receptor binder comprises a crosslinkable binder, such as that used in the second layer of the donor element, which is a hydroxylic polymer (a polymer having a plurality of hydroxy groups). In one embodiment of the present invention, 100% of the binder is a hydroxylic polymer. Another binder for use in the receiving layer is a polyvinyl pyrrolidone/vinyl acetate copolymer binder available under the trade designation E-735 from GAF, Manchester, UK. Another binder is a styrene-butadiene copolymer available under the trade designation PLIOLITE S5C from Goodyear, Akron, Ohio. Yet another binder is a phenoxy polymer available under the trade designation PAPHEN PKHM-301 from Phenoxy Associates. This latter binder is particularly compatible with guanidines, thereby allowing for higher loading of the guanidines. Other additives may also be present, such as surfactants and antioxidants.

Bleaching Agent

A problem common to many imaging systems is the fact that unless the cationic IR absorbing dye is completely colorless, the final image is contaminated and not a true color reproduction, and hence unacceptable for high quality proofing purposes. For example, if the cationic IR absorbing dye is transferred to a receptor during imaging, it can visibly interfere with the color produced because it absorbs slightly in the visible region of the spectrum. Attempts have been made to find cationic IR absorbing dyes with minimal visible absorption, as in, for example, EP 157 568 (ICI). In practice, however, there is nearly always some residual absorption, which has limited the usefulness of the technology.

In the system of the present invention, the second layer crosslinking agent discussed above also acts as a bleaching agent and contributes to the removal of this unwanted visible absorbance, so that a more accurate and predictable color may be achieved. However, the system of the present invention can additionally employ a separate thermal bleaching agent that is different from the second layer crosslinking agent.

Suitable thermal bleaching agents (also referred to as bleaching agents) do not require exposure to light to become active, but will bleach the cationic IR dyes at ambient or elevated temperatures. The term "bleaching" means a substantial reduction in absorption giving rise to color visible to the human eye, regardless of how this is achieved. For example, there may be an overall reduction in the intensity of the absorption, or it may be shifted to noninterfering wavelengths, or there may be a change in shape of the absorption band, such as, a narrowing, sufficient to render the cationic IR absorbing dye colorless.

Suitable thermal bleaching agents include nucleophiles, such as an amine or a salt that decomposes thermally to release an amine, or a reducing agent, as described in EP 675

003 (3M). In one embodiment of the present invention, the bleaching agents are amines such as guanidine or salts thereof, wherein the guanidine bleaching agents have the following general formula (VI):

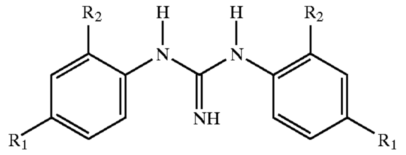

where each $R^1$ and $R^2$ is independently hydrogen or an organic group or hydrogen or an alkyl group, such as a $C_1$–$C_4$ alkyl group. Such diphenyl guanidines are commercially available from Aldrich Chemical Company, Milwaukee, Wis., or can be synthesized by reaction of cyanogen bromide with the appropriate aniline derivatives.

Guanidines have good stability, solubility, and compatibility with the binders disclosed herein. They are solids as opposed to liquids, and are rapid acting. Solids are advantageous because they are involatile at room temperature. They are relatively small molecules that diffuse very effectively into the transferred material when heated. Significantly, they do not discolor during storage, do not precipitate out of solvent-based systems prior to coating onto a substrate.

Another class of bleaching agent capable of bleaching the cationic IR absorbing dyes includes the 1,4-dihydropyridines of formula (V) described above, where $R^4$ is hydrogen or an alkyl group, such as an alkyl group having up to 5 carbon atoms. Such compounds bleach TAPM dyes of formula (I) in which no more than three of the aryl groups represented by $Ar^1$–$Ar^4$ bear a tertiary amino substituent. The bleaching is believed to occur via a redox reaction. This class of bleaching agents is only partially effective in bleaching amine cation radical dyes.

Thermal bleaching agents of this type include:

Formula (V-b)

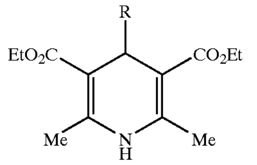

(where R is hydrogen or a $C_1$–$C_4$ alkyl group)

Formula (V-c)

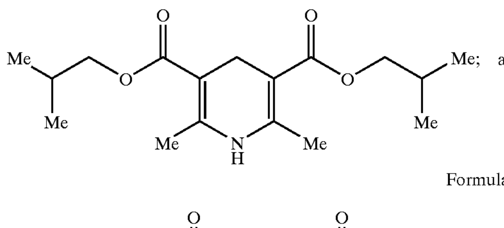

and

Formula (V-d)

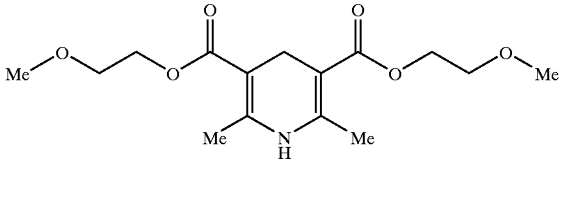

Whatever type of thermal bleaching agent is used, it is typically present prior to imaging in a receiving layer on the surface of the receptor element. It is equally possible, though, to deposit the thermal bleaching agent on the transferred image by appropriate means in an additional step subsequent to transfer of an image and separation of the donor and the receptor. Although the latter alternative requires an extra step, it has the advantage that no particular constraints are placed on the nature of the receptor, so that a variety of materials may be used for this purpose, including plain paper and conventional proofing bases. The former alternative, in which the bleaching agent is in a receiving layer on the receptor, streamlines the imaging process, but requires the use of a specially prepared receptor. In an alternative embodiment, the image residing on the receptor element after separating the donor and the receptor may be further transferred to a second receptor that comprises a layer containing a bleaching agent.

Quantities of about 10 mole % based on the compound of formula V-b are effective. Generally, loadings of from about 2 wt % to about 25 wt % of the bleaching agent in the receptor layer are suitable. Alternatively, loadings of from about 5 wt % to about 20 wt % are suitable.

Optional Additives

Coating aids, optical brighteners, UV absorbers, and fillers, for example, can also be incorporated into the overall receptor element composition. Surfactants may be used to improve solution stability. A wide variety of surfactants can be used. One surfactant is a fluorocarbon surfactant used to improve coating quality. Suitable fluorocarbon surfactants include fluorinated polymers, such as the fluorinated polymers described in U.S. Pat. No. 5,380,644 (Yonkoski, et al.). It is used in an amount of at least about 0.05 wt %, alternatively at least about 0.05 wt % and no greater than about 5 wt %, and typically in an amount of no greater than about 1–2 wt %.

Preparation of the Receptor Element

Receptor element layer compositions for use in the invention are readily prepared by dissolving or dispersing the various components in a suitable solvent, typically an organic solvent, and coating the mixture on a substrate. The solvent is typically present in an amount of at least about 80 wt %. The organic solvent is typically an alcohol, a ketone, an ether, a hydrocarbon, a haloalkane, or mixtures thereof. Suitable solvents include, for example, methanol, ethanol, propanol, 1-methoxy ethanol, 1-methoxy-2-propanol, methyl ethyl ketone, diethylene glycol monobutyl ether (butyl CARBITOL), and the like. Typically, a mixture of solvents is used, which assists in controlling the drying rate and avoiding forming cloudy films.

The relative proportions of the components of the receptor element may vary widely, depending on the particular choice of ingredients and the type of imaging required. In one embodiment of the present invention the receptor layer is obtained by coating the following formulation from methylethyl ketone (MEK) and toluene to provide a dry coating weight of 400 mg/$ft^2$ (4.3 g/$m^2$):

| | |
|---|---|
| styrene butadiene (e.g. PLIOLITE S5A) | about 70 to 90 wt % |
| texturizing material (e.g. poly(stearyl methacrylate) beads) | about 0.2–2.5 wt % |
| bleaching agent (e.g. diphenylguanidine) | about 2–25 wt % |

In another embodiment of the present invention the receptor layer is obtained by coating the following formulation from methylethyl ketone (MEK) to provide a dry coating weight of 400 mg/ft$^2$ (4.3 g/m$^2$):

| | |
|---|---|
| hydroxylic polymer (e.g., BUTVAR B76 available from Solutia, Inc. St. Louis, MO) | about 70 to 90 wt % |
| texturizing material (e.g. poly(stearyl methacrylate) beads) | about 0.2–2.5 wt % |
| bleaching agent (e.g. diphenylguanidine) | about 2–25 wt % |

Imaging Conditions

The procedure for imagewise transfer of material from donor to receptor involves assembling the two elements in intimate face-to-face contact, such as by vacuum hold down or alternatively by means of the cylindrical lens apparatus described in U.S. Pat. No. 5,475,418 (Patel, et al.) and scanned by a suitable laser. The assembly may be imaged by any of the commonly used lasers, depending on the cationic IR absorbing dye used. In one embodiment of the present invention exposure to laser radiation by near IR and IR emitting lasers such as diode lasers and YAG lasers, is employed.

Any of the known scanning devices may be used, such as flat-bed scanners, external drum scanners, or internal drum scanners. In these devices, the assembly to be imaged is secured to the drum or bed such as by vacuum hold-down, and the laser, beam is focused to a spot of about 20 micrometers diameter for instance, on the donor-receptor assembly. This spot is scanned over the entire area to be imaged while the laser output is modulated in accordance with electronically stored image information. Two or more lasers may scan different areas of the donor receptor assembly simultaneously, and if necessary, the output of two or more lasers may be combined optically into a single spot of higher intensity. Exposure to laser radiation is normally from the donor side, but may be from the receptor side if the receptor is transparent to the laser radiation.

Peeling apart the donor and receptor reveals a monochrome image on the receptor. The process may be repeated one or more times using donor sheets of different colors to build a multicolor image on a common receptor. Because of the interaction of the cationic IR absorbing dye and the bleaching agent during exposure to laser radiation, the final image can be free from contamination by the cationic IR absorbing dye. Typically, in the embodiments in which a bleaching agent is present in the receiving layer, subsequent heat treatment of the image may be required to activate or accelerate the bleach chemistry.

After peeling the donor sheet from the receptor, the image residing on the receptor can be cured by subjecting it to heat treatment where the temperatures are in excess of about 120° C. This may be carried out by a variety of means, such as by storage in an oven, hot air treatment, contact with a heated plate or passage through a heated roller device. In the case of multicolor imaging, where two or more monochrome images are transferred to a common receptor, it is more convenient to delay the curing step until all the separate colorant transfer steps have been completed, then provide a single heat treatment for the composite image. However, if the individual transferred images are particularly soft or easily damaged in their uncured state, then it may be necessary to cure and harden each monochrome image prior to transfer of the next.

In certain embodiments, the bleaching agent is present initially in neither the donor nor the receptor and an additional step is required to bring it into contact with the contaminated image. While this technique requires an extra step, it does allow the use of an uncoated receptor, such as plain paper. Any suitable means may be employed to apply the bleaching agent to the transferred image, but "wet" methods such as dipping or spraying, possess disadvantages compared to dry methods. A suitable dry method is thermal lamination and subsequent peeling of a separate donor sheet containing the thermal bleaching agent. A bleaching agent donor sheet suitable for this purpose typically comprises a substrate bearing a layer of a hydroxylic polymer containing the bleaching agent in an amount corresponding to from about 5 to 25 wt % of the total solids. Alternatively, the bleaching agent is present in an amount of from about 10 to 20 wt %. Thus the construction of a bleaching agent donor sheet in accordance with the invention is very similar to that of a receptor element in accordance with the invention, and indeed a single element might well be capable of fulfilling either purpose. In some situations, the receptor to which a colorant image is initially transferred is not the final substrate on which the image is viewed. For example, U.S. Pat. No. 5,126,760 (DeBoer) discloses thermal transfer of a multicolor image to a first receptor, with subsequent transfer of the composite image to a second receptor for viewing purposes. If this technique is employed in the practice of the present invention, curing and hardening of the image may conveniently be accomplished in the course of the transfer to the second receptor. In this embodiment of the invention, the second receptor may be a flexible sheet-form material such as paper, card, or plastic film, for example. Alternatively, it may be convenient to provide the thermal bleaching agent in the second receptor, and/or to utilize the heat applied in the process of transferring the image to the second receptor to activate the bleaching reaction.

In one embodiment of the present invention the imaging unit is the CREOSCITEX TRENDSETTER imager available commercially as the CREO TRENDSETTER SPECTRUM. The imaging conditions used are machine set points selected to best expose the media defined in the invention. Drum speed is revolutions per minute (RPM) the media is rotated in at the front of the laser thermal head. The Wpower is the total watts of imaging power from that head. SR stands for surface reflectivity and is measured by the laser thermal head focusing mechanism. This value is media dependent and is used to obtain best focusing performance. SD stands for surface depth and is set to obtain the best performance of the focusing mechanism. It is also media dependent. The methods to do these measurements are described in published Creo instruction manuals and technical literature. The machine stores these values and automatically selects them based on what color donor is to be imaged.

Further objects and advantages of the invention will become apparent from a consideration of the examples and ensuing description which illustrate embodiments of the invention, it being understood that the foregoing statements of the objects of the invention are intended to generally explain the same without limiting it in any manner.

EXAMPLES

The following materials are used in the Examples:

| | |
|---|---|
| Binder Material: | BUTVAR B-72 (polyvinylbutryal resin with free OH content of from about 17.5 to 20 mole %) available from Solutia Inc., St. Louis, MO<br>BUTVAR B-76 (polyvinylbutryal resin with free OH content of from about 11 to 13 mole %) available from Solutia, Inc |
| Infra-red Absorbing Dye: | PC 364 having the following structure:<br>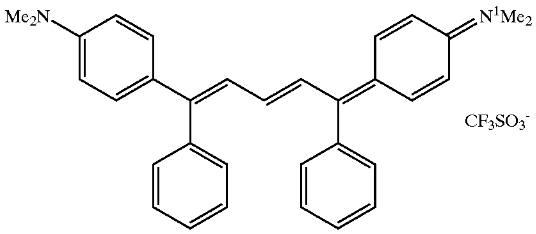<br>available from St. Jean Photochemicals, Quebec, Canada |
| First Layer Crosslinking Agent: | DESMODUR CB55N available from Bayer Corporation Coatings Division, Pittsburg, PA |
| First Layer Crosslinking Catalyst: | Dibutinyltin dilaureate available from Aldrich Chemical Company, Milwaukee, WI |
| Second Layer Crosslinking Agent: | HPA 1186 having the following structure:<br>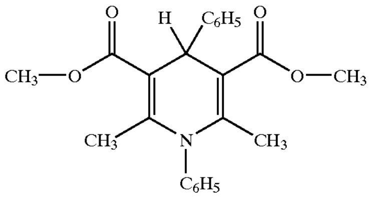<br>available from St Jean Photochemicals |
| Fluorocarbon: | FX 12 (N-methylperfluorooctanesulphonamide) available from 3M, St. Paul, MN |
| Metallic Flake: | Silberline 554 SPARKLE SILVER PREMIER, Aluminum ETERNABRITE, Aluminum, Aluminum EXTRAFINE (Aluminum metallic flake supplied by Silberline Manufacturing Co., Tamaqua, PA)<br>MICA 123 (AFFLAIR 123), Gold Mica Flake (AFFLAIR 302) available from EM Industries, New York, NY |
| Dispersible Material: | Red 170 available from Sun Chemical, Fort Lee, NJ<br>Neptun Black available from BASF, Ludwigshafen, Germany<br>Carbon Black available from Columbian Chemical, Marietta, GA<br>Red Shade Yellow available from Sun Chemical<br>Solvent Yellow 42 available from HW Sands, Jupiter, FL<br>Yellow available from Sun Chemical<br>ORASOL BLACK CN available from Ciba Specialty Chemicals, Tarrytown, NY<br>MACROLEX Red 11 available from Bayer Corporation Specialty Products, Rock Hill, SC<br>RS Cyan available from Sun Chemical<br>RS Magenta (Red 209) available from Clariant, Sulzbach an Tun, Germany |
| Optional Additives: | DISPERBYK 161 (dispersing agent) available from Byk-Chemie USA, Wallingford, CT<br>FC 55/35/10 (surfactant) available from 3M<br>IRCOGEL 906 (rheology control additive) available from Lubrizol, Wickliffe, OH)<br>SANTICIZER 278 available from Solutia, Inc. |
| Bleaching Agent: | Bleaching agent having the following structure:<br>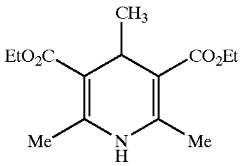<br>Diphenyl guanidine available from Aldrich Chemical Company |
| Solvent: | MIBK (methyl isobutyl ketone) available from Aldrich Chemical Company<br>1-methoxypropanol available from Aldrich Chemical Company |

-continued

| | |
|---|---|
| | MEK (methyl ethyl ketone) available from Aldrich Chemical Company |
| | Ethanol available from Aldrich Chemical Company |
| Substrate: | PET (polyethyleneterephthalate film) available from Dupont, Wilmington, DE |
| | ARTISAN printing plate (grained and anodized aluminum base printing plate base, obtained by removing the photosensitive coating) available from Kodak Polychrome Graphics, Norwalk, CT |
| | Kodak receptor sheet available from Kodak as APPROVAL base part of the APPROVAL proofing system |
| | VAGH and VYNS (vinyl copolymers resins) available from Union Carbide, Danbury, CT |
| | SCHOELLER 170M (proofing base including silica particles from 4 μm to 10 μm diameter in a resin coating on paper) available from Schoeller |
| | ICI 562 Film available from DuPont |
| Receptor: | RELEASE RECEPTOR III available from Kodak Polychrome Graphics |
| | MPDH commercial base available from Kodak Polychrome Graphics |
| Laminator: | 447L laminator available from Kodak Polychrome Graphics |

Example 1

This example demonstrates a method of coating the first or second layer mixtures onto a substrate.

An untreated poly(ethylene terephthalate) (PET) was used as the substrate unless otherwise indicated. A meyer bar was used to coat the first layer and second layer mixtures. The first layer of the donor element was coated with a meyer bar selected from the sizes of 4–6. The second layer of the donor element was coated with meyer bar selected from sizes of 8–12.

Example 2

This example demonstrates a donor element where the first layer was not crosslinked.

2.5% BUTVAR B-72
0.25% PC 364
97.25% 50/50 MEK/Ethanol solvent mixture

The mixture was stirred by an air mixer and then coated on ICI 562 film using a meyer bar. The coating weight was 30–60 mg/ft$^2$ to obtain an absorbance value (ABS) (at 830 nm) of 0.40–0.80. The coating was heat dried at 180° F. for 2 minutes.

Example 3

This example demonstrates a donor element where the first layer was crosslinked.

50.62% BUTVAR B-76
5.62% PC 364
42.95% DESMODUR CB55N
0.81% Dibutinyltin dilaureate
In MEK solvent.

The mixture was coated onto ICI 562 film and the coating weight was 20–90 mg/ft$^2$ to obtain an ABS (at 830 nm) of 0.8–1.0. The coated substrate was placed into an oven set at 190° F. for 2–4 hours to maximize crosslinking of the first layer.

The degree of crosslinking was tested by rubbing the coating with a swab wet with MEK to observe the degree of attack of the crosslinked first layer.

Example 4

This example demonstrates a Silver Donor second layer formulation.

1% Neptune Black
51.5% Silberline 554 SPARKLE SILVER PREMIER
1.25% Carbon Black
21.82% BUTVAR B-76
16% PC 364
3.5% HPA 1186
0.33% DISPERBYK 161
4.6% FX-12 and FC 55/35/10 at 0.05% of the solution.
In MEK solvent The dried coating weight was 50–120 mg/ft$^2$.

Example 5

This example demonstrates a Silver Donor second layer formulation.

0.35% ORASOL BLACK CN
16.5% Silberline 554 SPARKLE SILVER PREMIER
11.8% Silberline ETERNABRITE
0.205% RS Cyan
0.155% RS Magenta
21% SANTICIZER 278
26.5% BUTVAR B-76
7% PC-364
1% HPA 1186
1.29% FX 12
0.02% DISPERBYK 161
14.18 IRCOGEL 906
In MIBK solvent The dried coating weight was 50–120 mg/ft$^2$.

Example 6

This example demonstrates a Gold Donor second layer formulation.

6.78% Red Shade Yellow
23.28% Silberline 554 SPARKLE SILVER PREMIER
21.05% Gold Mica Flake
0.61% Red 170
24.3% BUTVAR B-76
17.2% PC 364
3.54% HPA 1186
3.24% FX-12 and FC 55/35/10 at 0.05% of the solution
In MEK solvent The dried coating weight was 50–120 mg/ft$^2$ Example 7

This example demonstrates a Gold Donor second layer formulation.

8.8% Red Shade Yellow
8.6% Solvent Yellow 42 Dye
59% Silberline 554 SPARKLE SILVER PREMIER
1% Red 170
10% BUTVAR B-76
8% PC 364
1.8% HPA
2.8% FX-12 and FC 55/35/10 at 0.05% of the solution
In MEK solvent The dried coating weight was 50–120 mg/ft$^2$ Example 8

This example demonstrates a Gold Donor second layer formulation.

2.30% ORASOL BLACK CN
4.20% Red Shade Yellow
13.7% Silberline 554 SPARKLE SILVER PREMIER
10.6% Silberline ETERNABRITE
20.0% Yellow
0.82 Red 170
15.82% SANTICIZER 278
12.39% BUTVAR B-76
7% PC 364
0.5% HPA 1186
0.5% FX-12
12.17% IRCOGEL 906
In MIBK solvent The dried coating weight was 50–120 mg/ft$^2$.

Example 9

The example demonstrates imaging of the donor.

The donor element was imaged using a CREO TRENDSETTER unit with the following imaging conditions:

Drum speed: 100 RPM
Wpower: 17 watts
SR: 0.75
SD: 40

The donor element was imaged onto RELEASE RECEPTOR III. The imaged receptor was then laminated to MPDH commercial base using a 447L laminator.

Example 10

The example demonstrates performance ratings for single layer (e.g. KODAK APPROVAL) and the dual layer laser thermal imaging systems of the present invention using the formulations disclosed in the prior examples. The single layer examples comprise only the second layer coating. The dual layer examples comprise both the first layer and second layer coatings with the first layer coating located in between the substrate and the second layer coating. Additionally, the example demonstrates examples where the first layer coating is both crosslinked and non-crosslinked.

The visual effect of metallic sparkle is described as being either flat or the desired brilliant. Other descriptors for visual effect include either discontinuous or continuous, in which continuous metallic images are desired. A visual effect including both brilliant and continuous indicates that the layer formulation is a combination having good halftone reproduction and metallic sparkle and is therefore a combination used to produce an accurate halftone color proof.

| Layer Formulation | Single Layer | Dual Layer | Visual Effect |
|---|---|---|---|
| | Non-crosslinked Layer 1 | | |
| Example 4 (silver) | X | | Flat |
| Example 2 (non-crosslinked) | | X | Brilliant |
| Example 4 (silver) | | | Discontinuous |
| Example 5 (silver) | X | | Flat |
| Example 2 (non-crosslinked) | | X | Brilliant |
| Example 5 (silver) | | | Continuous |
| Example 6 (gold) | X | | Flat |
| Example 2 (non-crosslinked) | | X | Brilliant |
| Example 6 (gold) | | | Discontinuous |
| Example 7 (gold) | X | | Flat |
| Example 2 (non-crosslinked) | | X | Brilliant |
| Example 7 (gold) | | | Continuous |
| Example 8 (gold) | X | | Flat |
| Example 2 (non-crosslinked) | | X | Brilliant |
| Example 8 (gold) | | | Discontinuous |
| | Crosslinked Layer 1 | | |
| Example 4 (silver) | X | | Flat |
| Example 3 (crosslinked) | | X | Brilliant |
| Example 4 (silver) | | | Discontinuous |
| Example 5 (silver) | X | | Flat |
| Example 3 (crosslinked) | | X | Brilliant |
| Example 5 (silver) | | | Continuous |
| Example 6 (gold) | X | | Flat |
| Example 3 (crosslinked) | | X | Brilliant |
| Example 6 (gold) | | | Discontinuous |
| Example 7 (gold) | X | | Flat |
| Example 3 (crosslinked) | | X | Brilliant |
| Example 7 (gold) | | | Continuous |
| Example 8 (gold) | X | | Flat |
| Example 3 (crosslinked) | | X | Brilliant |
| Example 8 (gold) | | | Discontinuous |

The complete disclosure of all patents, patent documents, and publications cited herein arc incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

While particular embodiments of the present invention have been disclosed, it is to be understood that various different modifications are possible and are contemplated within the true spirit and scope of the appended claims. There is no intention, therefore, of limiting the exact abstract or disclosure herein presented.

What is claimed is:

1. A laser-induced thermal imaging system comprising:

(a) a multi-layer construction donor element comprising a substrate coated with at least:
- a first layer coated on one side of the substrate having:
  - a first donor binder; and
  - a cationic infrared absorbing dye; and
- a distinct second layer covering the first layer having:
  - a second donor binder;
  - a cationic infrared absorbing dye;

a second layer crosslinking agent of the formula:

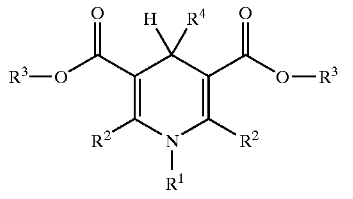

wherein $R^1$ is hydrogen, alkyl, cycloalkyl, or aryl and each $R^2$ and $R^3$ is independently alkyl or aryl and $R^4$ is aryl;

a fluorocarbon additive;

metallic flakes; and a dispersible material;

(b) a receptor element comprising a substrate coated with at least a receptor binder; and a bleaching agent.

2. The laser-induced thermal imaging system of claim 1 wherein the first donor binder comprises a hydroxylic polymer.

3. The laser-induced thermal imaging system of claim 1 wherein the first donor binder is polyvinyl butyral.

4. The laser-induced thermal imaging system of claim 1 wherein the first donor binder is present in an amount of about 35 to about 65 wt % based on total weight of the first layer.

5. The laser-induced thermal imaging system of claim 1 wherein the first donor binder does not crosslink when exposed to laser thermal energy.

6. The laser-induced thermal imaging system of claim 1 wherein the cationic infrared absorbing dye in either the first layer or the second layer is a bleachable dye.

7. The laser-induced thermal imaging system of claim 1 wherein the cationic infrared absorbing dye is a tetraarylpolymethine dye, an amine cation radical dye, or mixtures thereof.

8. The laser-induced thermal imaging system of claim 7 wherein the cationic infrared absorbing dye is a tetraarylpolymethine dye.

9. The laser-induced thermal imaging system of claim 8 wherein the tetraarylpolymethine dye is of the formula:

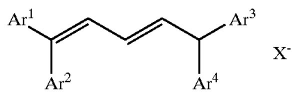

wherein each $Ar^1$, $Ar^2$, $Ar^3$ and $Ar^4$ is aryl and at least one aryl has a cationic amino substituent, and X is an anion.

10. The laser-induced thermal imaging system of claim 8 wherein the tetraarylpolymethine dye is of the formula:

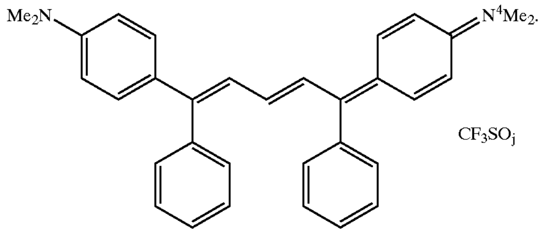

11. The laser-induced thermal imaging system of claim 1 wherein the cationic infrared dye of the first layer is present in an amount of about 3 to about 20 wt % based on total weight of the first layer.

12. The laser-induced thermal imaging system of claim 1 wherein the cationic infrared dye of the second layer is present in an amount of about 5 to about 15 wt % based on total weight of the second layer.

13. The laser-induced thermal imaging system of claim 1 wherein the second donor binder comprises a hydroxylic polymer.

14. The laser-induced thermal imaging system of claim 1 wherein the second donor binder is polyvinyl butyral.

15. The laser-induced thermal imaging system of claim 1 wherein the second donor binder is crosslinked when exposed to laser thermal energy.

16. The laser-induced thermal imaging system of claim 1 wherein the second donor binder is present in an amount of about 10 to about 55 wt % based on total weight of the second layer.

17. The laser-induced thermal imaging system of claim 1 wherein the second donor binder is a blend of one or more crosslinkable hydroxylic polymers with one or more non-crosslinkable polymers selected from the group consisting of polyesters, polyamides, polycarbamates, polyolefins, polystyrenes, polyethers, polyvinyl ethers, polyvinyl esters, polyacrylates, polymethacrylates, polymethyl methacrylates, and combinations thereof.

18. The laser-induced thermal imaging system of claim 1 wherein the second layer crosslinking agent is of the formula:

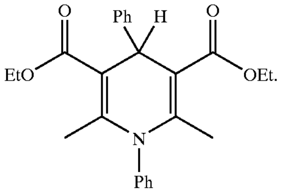

19. The laser-induced thermal imaging system of claim 1 wherein the second layer crosslinking agent is present in an amount of about 1 to about 5 wt % based on total weight of the second layer.

20. The laser-induced thermal imaging system of claim 1 wherein the fluorocarbon additive comprises a sulfonamido compound.

21. The laser-induced thermal imaging system of claim 1 wherein the fluorocarbon additive comprises $(C_8F_{17})SO_2NH(CH_2CH_3)$.

22. The laser-induced thermal imaging system of claim 1 wherein the fluorocarbon additive is present in an amount of about 0.5 to about 5.0 wt % based on total weight of the second layer.

23. The laser-induced thermal imaging system of claim 1 wherein the metallic flakes are aluminum, mica, or mixtures thereof.

24. The laser-induced thermal imaging system of claim 1 wherein the metallic flakes of are aluminum.

25. The metallic flakes of claim 1 wherein the metallic flakes have a particle size from about 7 to 24 microns.

26. The laser-induced thermal imaging system of claim 1 wherein the metallic flakes are present in an amount of about 20 to about 50 wt % based on the total weight of the second layer.

27. The laser-induced thermal imaging system of claim 1 wherein the dispersible material is a pigment, a crystalline nonsublimable dye, a color enhancing additive, a texturizing material, or mixtures thereof.

28. The laser-induced thermal imaging system of claim 27 wherein the dispersible material comprises a pigment.

29. The laser-induced thermal imaging system of claim 27 wherein the dispersible material comprises texturizing particles.

30. The laser-induced thermal imaging system of claim 1 wherein the first layer further comprises optional additives selected from the group consisting of coating aids, dispersing agents, optical brighteners, UV absorbers, fillers, surfactants and combinations thereof.

31. The laser-induced thermal imaging system of claim 1 wherein the second layer further comprises optional additives selected from the group consisting of coating aids, dispersing agents, optical brighteners, UV absorbers, fillers, surfactants and combinations thereof.

32. The laser-induced thermal imaging system of claim 1 wherein the receptor binder comprises a hydroxylic polymer.

33. The laser-induced thermal imaging system of claim 1 wherein the receptor binder is polyvinyl butyral.

34. The laser-induced thermal imaging system of claim 1 wherein the receptor binder is a polyvinyl pyrrolidone/vinyl acetate copolymer binder, a styrene-butadiene copolymer, a phenoxy resin, or combinations thereof.

35. The laser-induced thermal imaging system of claim 1 wherein the bleaching agent is an amine, a salt that decomposes thermally to release an amine, a reducing agent or combinations thereof.

36. The laser-induced thermal imaging system of claim 1 wherein the bleaching agent comprises a guanidine of the formula:

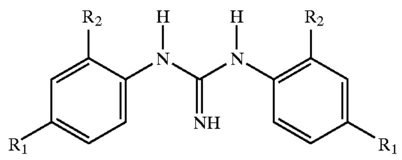

wherein each $R^1$ and $R^2$ is independently hydrogen or an organic group.

37. The laser-induced thermal imaging system of claim 36 wherein each $R^1$ and $R^2$ is independently hydrogen or alkyl.

38. The laser-induced thermal imaging system of claim 1 wherein the bleaching agent comprises a 1,4-dihydropyridine.

39. The laser-induced thermal imaging system of claim 1 wherein the receptor element further comprises optional additives selected from the group consisting of particulate material, surfactants, antioxidants and combinations thereof.

40. The laser-induced thermal imaging system of claim 1 wherein the receptor element comprises a substrate having a textured receiving layer surface comprising a plurality of protrusions projecting above the outer surface of the substrate by an average distance of about 1 $\mu$m to about 8 $\mu$m.

41. The laser-induced thermal imaging system of claim 40, wherein the protrusions are formed from particulate material.

42. The laser-induced thermal imaging system of claim 41, wherein the particulate material comprises polymeric beads.

43. The laser-induced thermal imaging system of claim 42 wherein the polymeric beads are polymethylmethacrylate beads, polystearyl methacrylate beads, or mixtures thereof.

44. The laser-induced thermal imaging system of claim 1 wherein the substrate of the receptor element is coated paper, metals, films or plates composed of various film-forming synthetic or high molecular weight polymers including addition polymers, wherein the addition polymers are selected from the group consisting of poly(vinylidene chloride), poly(vinyl chloride), poly(vinyl acetate), polystyrene, polyisobutylene polymers and copolymers, linear condensation polymers (e.g., poly(ethylene terephthalate), poly(hexamethylene adipate), poly (hexamethylene adipamide/adipate), and combinations thereof.

45. The laser induced thermal imaging system of claim 1 wherein the substrate of the receptor element is paper or plastic film coated with a thermoplastic receiving layer.

46. The laser-induced thermal imaging system of claim 1 which produces a transferred image having a resolution of at least about 300 dots per inch.

47. The laser-induced thermal imaging system of claim 1 which produces a transferred image having a resolution of at least about 1000 dots per inch.

48. The laser-induced thermal imaging system of claim 1 which produces a transferred image at a sensitivity of no greater than about 0.5 Joule/$cm^2$.

49. A laser-induced thermal imaging system comprising:

(a) a multi-layer construction donor element comprising a substrate coated with at least:
  a first layer coated on one side of the substrate having:
    a first donor binder;
    a cationic infrared absorbing dye; and
    optional additives; and
  a distinct second layer covering the first layer having:
    a second donor binder;
    a cationic infrared absorbing dye;
    a second layer crosslinking agent of the formula:

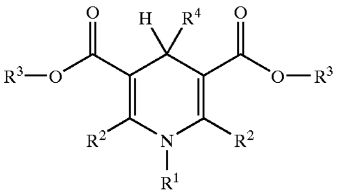

wherein $R^1$ is hydrogen, alkyl, cycloalkyl, or aryl and each $R^2$ and $R^3$ is independently alkyl or aryl, and $R^4$ is aryl;
    a fluorocarbon additive;
    metallic flakes;
    a dispersible material; and
    optional additives; and (b) a receptor element comprising a substrate coated with at least
  a receptor binder;
  a bleaching agent; and
  optional additives.

50. A laser-induced thermal imaging system comprising:

a multi-layer construction donor element comprising a substrate coated with at least:
  a first layer coated on one side of the substrate having:
    a first donor binder; and
    a cationic infrared absorbing dye; and
  a distinct second layer covering the first layer having:
    a second donor binder;
    a cationic infrared absorbing dye;

a second layer crosslinking agent of the formula:

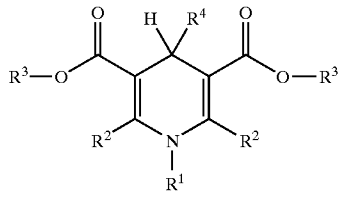

wherein $R^1$ is hydrogen, alkyl, cycloalkyl, or aryl and each $R^2$ and $R^3$ is independently alkyl or aryl, and $R^4$ is aryl;
a fluorocarbon additive;
metallic flakes; and
a dispersible material.

51. A method of imaging comprising:
(a) providing a multi-layer construction donor element comprising a substrate coated with at least:
a first layer coated on one side of the substrate having:
a first donor binder, and
a cationic infrared absorbing dye; and
a distinct second layer covering the first layer having:
a second donor binder;
a cationic infrared absorbing dye;
a second layer crosslinking agent of the formula:

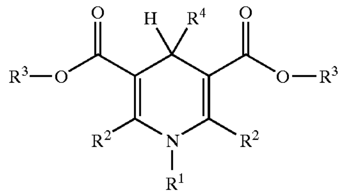

wherein $R^1$ is hydrogen, alkyl, cycloalkyl, or aryl and each $R^2$ and $R^3$ is independently alkyl or aryl, and $R^4$ is aryl;
a fluorocarbon additive;
metallic flakes; and
a dispersible material;
(b) providing a receptor element comprising a substrate coated with at least
a receptor binder; and
a bleaching agent;
(c) assembling the donor element in contact with the receptor element and exposing the assembly to laser radiation of a wavelength absorbed by the cationic infrared absorbing dye, said laser radiation being modulated in accordance with digitally stored image information, thereby transferring portions of the second layer from the donor element to the receptor element;
(d) separating the donor element and receptor element, leaving an image residing on the receptor element; and
(c) subjecting the receptor and image residing thereon to heat treatment.

52. The method of imaging of claim 51 wherein the first donor binder and the cationic infrared absorbing dye of the first layer are dispersed with an organic solvent and coated on top of one side of the substrate of the donor element.

53. The method of imaging of claim 52 wherein the organic solvent of the first layer is methyl ethyl ketone, methyl isobutyl ketone, ethanol or mixtures thereof.

54. The method of imaging of claim 51 wherein the second donor binder, the cationic infrared absorbing agent, the latent crosslinking agent, the fluorocarbon, the metallic flakes, and the dispersible materials are dissolved with an organic solvent and coated on top of the first layer of the donor element.

55. The method of imaging of claim 54 wherein the organic solvent of the second layer is methyl ethyl ketone, methyl isobutyl ketone, or ethanol.

56. The method of imaging of claim 51 wherein steps (1)–(3) form a cycle which is repeated, wherein a different donor element comprising a different colorant is used for each cycle, but the same receptor element is used for each cycle.

57. The method of imaging of claim 56 wherein the image residing on the receptor after all the repetitions of steps (1)–(3) is transferred to another receptor as a final step.

* * * * *